US010457553B2

(12) United States Patent
Tay et al.

(10) Patent No.: US 10,457,553 B2
(45) Date of Patent: Oct. 29, 2019

(54) BORON NITRIDE MATERIAL AND METHOD OF PREPARATION THEREOF

(71) Applicant: NANYANG TECHNOLOGICAL UNIVERSITY, Singapore (SG)

(72) Inventors: Yingjie Roland Tay, Singapore (SG); Hongling Li, Singapore (SG); Siu Hon Tsang, Singapore (SG); Hang Tong Edwin Teo, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 16/068,590

(22) PCT Filed: Jan. 9, 2017

(86) PCT No.: PCT/SG2017/050011
§ 371 (c)(1),
(2) Date: Jul. 6, 2018

(87) PCT Pub. No.: WO2017/119851
PCT Pub. Date: Jul. 13, 2017

(65) Prior Publication Data
US 2019/0016600 A1    Jan. 17, 2019

(30) Foreign Application Priority Data

Jan. 8, 2016    (SG) ............................ 10201600155R

(51) Int. Cl.
*C01B 21/064*    (2006.01)
*C23C 16/36*    (2006.01)
(Continued)

(52) U.S. Cl.
CPC .......... *C01B 21/064* (2013.01); *C04B 35/583* (2013.01); *C04B 35/6229* (2013.01);
(Continued)

(58) Field of Classification Search
None
See application file for complete search history.

(56) References Cited

U.S. PATENT DOCUMENTS

| 5,169,613 A | 12/1992 | Shore et al. |
| 7,144,803 B2 | 12/2006 | Engbrecht et al. |

(Continued)

FOREIGN PATENT DOCUMENTS

| CN | 103232027 A | 8/2013 |
| CN | 104129763 A | 11/2014 |
| JP | 6-115913 A | 4/1994 |

OTHER PUBLICATIONS

Google translation of CN103232027; Jan. 6, 2019.*
(Continued)

*Primary Examiner* — Guinever S Gregorio
(74) *Attorney, Agent, or Firm* — Seed IP Law Group LLP

(57) ABSTRACT

A method of preparing a boron nitride material, such as boron nitride (BN) or boron carbonitride (BCN), is provided. The method may include providing a substrate, and sublimating an amine borane complex onto the substrate to obtain the boron nitride material. The amine borane complex may include, but is not limited to, borazine, amino borane, trimethylamine borane and triethylamine borane. In addition, the temperature at which the sublimating is carried out may be varied to control composition of the boron nitride material formed. In addition, various morphologies can be obtained by using the present method, namely films, nanotubes and porous foam.

14 Claims, 35 Drawing Sheets

(51) Int. Cl.

| | |
|---|---|
| C04B 35/583 | (2006.01) |
| C04B 35/622 | (2006.01) |
| C04B 35/628 | (2006.01) |
| C04B 38/00 | (2006.01) |
| C23C 16/01 | (2006.01) |
| C23C 16/02 | (2006.01) |
| C23C 16/34 | (2006.01) |
| C30B 29/40 | (2006.01) |
| C23C 16/56 | (2006.01) |
| C30B 25/02 | (2006.01) |
| C04B 38/06 | (2006.01) |
| C30B 25/18 | (2006.01) |
| C30B 29/60 | (2006.01) |

(52) U.S. Cl.
CPC .. *C04B 35/62218* (2013.01); *C04B 35/62868* (2013.01); *C04B 38/0022* (2013.01); *C04B 38/0029* (2013.01); *C04B 38/0615* (2013.01); *C23C 16/01* (2013.01); *C23C 16/0227* (2013.01); *C23C 16/342* (2013.01); *C23C 16/36* (2013.01); *C23C 16/56* (2013.01); *C30B 25/02* (2013.01); *C30B 25/18* (2013.01); *C30B 29/403* (2013.01); *C30B 29/602* (2013.01); *C01P 2002/60* (2013.01); *C04B 2235/5284* (2013.01); *C04B 2235/5288* (2013.01); *C04B 2235/6028* (2013.01)

(56) References Cited

U.S. PATENT DOCUMENTS

2013/0140526 A1\* 6/2013 Kim ...................... C01B 21/064
257/29
2015/0033937 A1 2/2015 Lashmore et al.

OTHER PUBLICATIONS

Alton et al., "Vapor Pressures of the Methylamine-Boranes and Ammonia-Triborane," 81:3550-3551, 1959. Downloaded via Nanyang Technological Univ on Aug. 11, 2018.
Auwärter et al., "Defect lines and two-domain structure of hexagonal boron nitride films on Ni(1 1 1)," *Surface Science* 545:L735-L740, 2003.
Avsar et al., "Air-Stable Transport in Graphene-Contacted, Fully Encapsulated Ultrathin Black Phosphorus-Based Field-Effect Transistors," *ACS NANO* 9(4):4138-4145, 2015.
Baake et al., "Chemical character of $BC_xN_y$ layers grown by CVD with trimethylamine borane," *X-Ray Spectrom* 38:68-73, 2009.
Bissot et al., "Preparation and Properties of Trimeric N-Methylaminoborane," downloaded via Nanyang Technological Univ on Aug. 11, 2018.
Blase et al., "Quasiparticle band structure of bulk hexagonal boron nitride and related systems," Physical Review B 51(11):6868-6875, 1995. (9 pages).
Bowden et al., "Structure and thermal decomposition of methylamine borane," *Inorganica Chimica Acta* 361:2147-2153, 2008.
Britnell et al., "Field-Effect Tunneling Transistor Based on Vertical Graphene Heterostructures," *Science* 335:947-950, 2012. (5 pages).
Chang et al., "Band Gap Engineering of Chemical Vapor Deposited Graphene by in Situ BN Doping," *ACSNANO* 7(2):1333-1341, 2013.
Cheng et al., "BN coatings prepared by low pressure chemical vapor deposition using boron trichloride-ammonia-hydrogen-argon mixture gases," *Surface & Coatings Technology* 204:2797-2802, 2010.
Choi et al., "Preparation of hexagonal boron nitride by low pressure chemical vapour deposition in the $BBr_3 + NH_3 + H_2$ system," *Journal of Materials Science Letters* 14:452-454, 1995.
Chopra et al., "Boron Nitride Nanotubes," *Science* 269:966-967, 1995. (3 pages).

Ci et al., "Atomic layers of hybridized boron nitride and graphene domains," *Nature Materials* 9:430-435, 2010.
Coudurier et al., "Growth of boron nitride on (0001) A1N templates by High Temperature-Hydride Vapor Phase Epitaxy (HT-HVPE)," *Physics Procedia* 46:102-106, 2013.
Das et al., "All Two-Dimensional, Flexible, Transparent, and Thinnest Thin Film Transistor," Nano Lett. 14:2861-2866, 2014. (7 pages).
Dean et al., "Boron nitride substrates for high-quality graphene electronics," *Nature Nanotechnology* 5:722-726, 2010.
Dumont et al., "Deposition and characterization of BN/Si(0 0 1) using tris(dimethylamino)borane," *Materials Research Bulletin* 37:1565-1572, 2002.
Essafti et al., "Study of boron nitride deposition process from diborane and ammonia gas mixtures," *Vacuum* 45(10):1029-1030, 1994.
Estrade-Szwarckopf, "XPS photoemission in carbonaceous materials: A "defect" peak beside the graphitic asymmetric peak," *Carbon* 42:1713-1721, 2004.
Fazen et al., "Synthesis, Properties, and Ceramic Conversion Reactions of Polyborazylene. A High-Yield Polymeric Precursor to Boron Nitride," *Chem. Mater.* 7:1942-1956, 1995.
Feng et al., "Few-atomic-layerboronnitridesheetssynthesesandapplications for semiconductordiodes," *MaterialsLetters* 89:206-208, 2012.
Ferrari et al., "Raman Spectrum of Graphene and Graphene Layers," *PRL* 97:187401, 2006. (4 pages).
Franz et al., "Diborane nitrogen/ammonia plasma chemistry investigated by infrared absorption spectroscopy," *Thin Solid Films* 379:37-44, 2000.
Fujihara et al., "Field-Induced Orientation of Hexagonal Boron Nitride Nanosheets Using Microscopic Mold for Thermal Interface Materials," *J. Am. Ceram. Soc.* 95(1):369-373, 2012.
Gao et al., "Repeated growth and bubbling transfer of graphene with millimetre-size single-crystal grains using platinum," Nature Communications 3:622, 2012. (7 pages).
Geick et al., "Nornral Modes in Hexagonal Boron Nitride," *Physical Review* 146(2):543-547, 1966.
Gillgren et al., "Gate tunable quantum oscillations in air-stable and high mobility few-layer phosphorene heterostructures," *2D Mater.* 2:011001, 2015. (8 pages).
Glavin et al., "Synthesis of few-layer, large area hexagonal-boron nitride by pulsed laser deposition," *Thin Solid Films* 572:245-250, 2014.
Gorbachev et al., "Hunting for Monolayer Boron Nitride: Optical and Raman Signatures," *Small* 7(4):462-468, 2011.
Grant et al., "Thermochemistry for the Dehydrogenation of Methyl-Substituted Ammonia Borane Compounds," *J. Phys. Chem. A* 113:6121-6132, 2009.
Harwell et al., "Possible Emission of the Dineutron in Fission," Nature 162(213):722-723, 1948.
Huang et al., "Carbon-doped BN nanosheets for metal-free photoredox catalysis," *Nature Communications* 6:7698, 2015. (7 pages).
Ismach et al., "Toward the Controlled Synthesis of Hexagonal Boron Nitride Films," *ACS Nano* 6(7):6378-6385, 2012.
Jäger et al., "Infrared spectroscopic investigations on h-BN and mixed h/c-BN thin films," *Thin Solid Films* 245:50-54, 1994.
Jaska et al., "Transition Metal-Catalyzed Formation of Boron-Nitrogen Bonds: Catalytic Dehydrocoupling of Amine-Borane Adducts to Form Aminoboranes and Borazines," *J. Am. Chem. Soc.* 125:9424-9434, 2003.
Kida et al., "Synthesis of boron carbonitride (BCN) films by plasma-enhanced chemical vapor deposition using trimethylamine borane as a molecular precursor," *Vacuum* 83:1143-1146, 2009.
Kidambi et al., "In Situ Observations during Chemical Vapor Deposition of Hexagonal Boron Nitride on Polycrystalline Copper," *Chem. Mater.* 26:6380-6392, 2014.
Kim et al., "Growth of High-Crystalline, Single-Layer Hexagonal Boron Nitride on Recyclable Platinum Foil," *Nano Lett.* 13:1834-1839, 2013.
Kim et al., "Synthesis of Monolayer Hexagonal Boron Nitride on Cu Foil Using Chemical Vapor Deposition," *Nano Lett.* 12:161-166, 2012.

(56) References Cited

OTHER PUBLICATIONS

Kosinova et al., "Chemical Composition of Boron Carbonitride Films Grown by Plasma-Enhanced Chemical Vapor Deposition from Trimethylamineborane," *Inorganic Materials* 39(4):447-455, 2003. (9 pages).

Kosinova et al., "The structure study of boron carbonitride films obtained by use of trimethylamine borane complex," *Nuclear Instruments and Methods in Physics Research A* 470:253-257, 2001.

Kotakoski et al., "Electron knock-on damage in hexagonal boron nitride monolayers," *Physical Review B* 82:113404, 2010. (4 pages).

Li et al., "Transfer of Large-Area Graphene Films for High-Performance Transparent Conductive Electrodes," *Nano Lett.* 9(12):4359-4363, 2009.

Lipp et al., "Hexagonal Boron Nitride: Fabrication, Properties and Applications," *Journal of the European Ceramic Society* 5:3-9, 1989.

Liu et al., "Ultrathin high-temperature oxidation-resistant coatings of hexagonal boron nitride," *Nature Communications* 4:2541, 2013. (8 pages).

Liu et al., "Unusual role of epilayer-substrate interactions in determining orientational relations in van der," *PNAS* 111(47):16670-16675, 2014.

Loeblein et al., "3D Graphene-Infused Polyimide with Enhanced Electrothermal Performance for Long-Term Flexible Space Applications," *Small* 11(48):6425-6434, 2015.

Loeblein et al., "Configurable Three-Dimensional Boron Nitride-Carbon Architecture and Its Tunable Electronic Behavior with Stable Thermal Performances," *Small* 10(15):2992-2999, 2014.

Lourie et al., "CVD Growth of Boron Nitride Nanotubes," *Chem. Mater.* 12:1808-1810, 2000.

Lu et al., "Synthesis of large single-crystal hexagonal boron nitride grains on Cu—Ni alloy," *Nature Communications* 6:6160, 2015. (7 pages).

Nakhaie et al.,"Synthesis of atomically thin hexagonal boron nitride films on nickel foils by molecular beam epitaxy," *Applied Physics Letters* 106:213108, 2015. (6 pages).

Paine et al., "Synthetic Routes to Boron Nitride," *Chem. Rev.* 90:73-91, 1990.

Pakdel et al., "A comprehensive analysis of the CVD growth of boron nitride nanotubes," *Nanotechnology* 23:215601, 2012. (11 pages).

Pierson, "Boron Nitride Composites by Chemical Vapor Deposition," *J. Composite Materials*, 9:228-240, 1975.

Qin et al., "Catalyst-free growth of mono- and few-atomic-layer boron nitride sheets by chemical vapor deposition," *Nanotechnology* 22:215602, 2011. (7 pages).

Rohr et al., "The growth of hexagonal boron nitride thin films on silicon using single source precursor," *Thin Solid Films* 322:9-13, 1998.

Ronning et al., "Carbon nitride deposited using energetic species: A review on XPS studies," *Physical Review B* 58(4):2207-2215, 1998.

Roy et al., "Field-Effect Transistors Built from All Two-Dimensional Material Components," *ACS Nano* 8(6):6259-6264, 2014.

Ryu et al., "Atomic-scale dynamics of triangular hole growth in monolayer hexagonal boron nitride under electron irradiation," *Nanoscale* 7:10600-10607, 2015. (7 pages).

Sano, "Chemical Vapour Deposition of Thin Films of BN Onto Fused Silica and Sapphire," *Thin Solid Films* 83:247-251, 1981.

Shi et al., "Synthesis of Few-Layer Hexagonal Boron Nitride Thin Film by Chemical Vapor Deposition," *Nano Lett.* 10:4134-4139, 2010.

Singh et al., "Band gap effects of hexagonal boron nitride using oxygen plasma," *Applied Physics Letters* 104:163101, 2014. (5 pages).

Song et al., "Chemical vapor deposition growth of large-scale hexagonal boron nitride with controllable orientation," *Nano Res.* 8(10):3164-3176, 2015. (14 Pages).

Song et al., "Large Scale Growth and Characterization of Atomic Hexagonal Boron Nitride Layers," *Nano Lett.* 10:3209-3215, 2010.

Spizzirri et al., "Nano-Raman spectroscopy of silicon surfaces," *arXiv: 1002.2692*, archived Feb. 13, 2010, 5 pages.

Sun et al., "Cooling Hot Spots by Hexagonal Boron Nitride Heat Spreaders," 65th *Electronic Components & Technology Conference*, San Diego, California, USA, May 26-29, 2015, pp. 1658-1663. (7 pages).

Sutter et al., "Scalable Synthesis of Uniform Few-Layer Hexagonal Boron Nitride Dielectric Films," *Nano Lett.* 13:276-281, 2013.

Suzuki et al., "Growth of atomically thin hexagonal boron nitride films by diffusion through a metal film and precipitation," *J. Phys. D: Appl. Phys.* 45:385304, 2012. (9 pages).

Tay et al., "Trimethylamine Borane: A New Single-Source Precursor for Monolayer h-BN Single Crystals and h-BCN Thin Films," *Chem. Mater.* 28:2180-2190, 2016.

Tay et al., "A systematic study of the atmospheric pressure growth of large-area hexagonal crystalline boron nitride film," *J. Mater. Chem. C* 2:1650-1657, 2014.

Tay et al., "Direct growth of nanocrystalline hexagonal boron nitride films on dielectric substrates," *Applied Physics Letters* 106:101901, 2015. (6 pages).

Tay et al., "Facile Synthesis of Millimeter-Scale Vertically Aligned Boron Nitride Nanotube Forests by Template-Assisted Chemical Vapor Deposition," *Chem. Mater.* 27:7156-7163, 2015.

Tay et al., "Growth of Large Single-Crystalline Two-Dimensional Boron Nitride Hexagons on Electropolished Copper," *Nano Lett.* 14:839-846, 2014.

Tay et al., "Synthesis of aligned symmetrical multifaceted monolayer hexagonal boron nitride single crystals on resolidified copper," *Nanoscale* 8:2434-2444, 2016.

Trehan et al., "Auger and x-ray electron spectroscopy studies of hBN, cBN, and N₂⁺ ion irradiation of boron and boron nitride," *J. Vac. Sci. Technol. A* 8(6):4026-4032, 1990. (8 pages).

Wang et al., "Controlled Growth of Few-Layer Hexagonal Boron Nitride on Copper Foils Using Ion Beam Sputtering Deposition," *Small* 11(13):1542-1547, 2015.

Wang et al., "Growth and Etching of Monolayer Hexagonal Boron Nitride," *Adv. Mater.* 27:4858-4864, 2015.

Watanabe et al., "Direct-bandgap properties and evidence for ultraviolet lasing of hexagonal boron nitride single crystal," *nature materials* 3:404-409, 2004.

Watanabe et al., "Far-ultraviolet plane-emission handheld device based on hexagonal boron nitride," *Nature Photonics* 3:591-594, 2009. (5 pages).

Wood et al., "van der Waals epitaxy of monolayer hexagonal boron nitride on copper foil: growth, crystallography and electronic band structure," *2D Mater* 2:025003, 2015. (10 pages).

Xu et al., "Formation of monolayer and few-layer hexagonal boron nitride nanosheets via surface segregation," *Nanoscale* 3:2854-2858, 2011.

Yin et al., "Large Single-Crystal Hexagonal Boron Nitride Monolayer Domains with Controlled Morphology and Straight Merging Boundaries," *Small* 11(35):4497-4502, 2015.

Yin et al., "Ultralight Three-Dimensional Boron Nitride Foam with Ultralow Permittivity and Superelasticity," *Nano Lett.* 13:3232-3236, 2013.

Younes et al., "Deposition of nanocrystalline translucent h-BN films by chemical vapor deposition at high temperature," *Thin Solid Films* 520:2424-2428, 2012.

Yuzuriha et al., "Structural and Optical Properties of Plasmadeposited Boron Nitride Films," *Thin Solid Films* 140:199-207, 1986.

Zhang et al., "Controllable Co-segregation Synthesis of Wafer-Scale Hexagonal Boron Nitride Thin Films," *Adv. Mater.* 26:1776-1781, 2014.

Zhang et al., "Direct growth of large-area graphene and boron nitride heterostructures by a co-segregation method," *Nature Communications* 6:6519, 2015. (9 pages).

Zhao et al., "3D white graphene foam scavengers: vesicant-assisted foaming boosts the gram-level yield and forms hierarchical pores for superstrong pollutant removal applications," *NPG Asia Materials* 7:e168, 2015. (8 pages).

(56) References Cited

OTHER PUBLICATIONS

Engbrecht, E.R., et al. "Chemical vapor deposition boron carbonitride deposited using dimethylamine borane with ammonia and ethylene "*J. Vac. Sci. Technol. A 22*(5), Sep./Oct. 2004, pp. 2152-2158.

Lee, Kang Hyuck, et al. "Large-Scale Synthesis of High-Quality Hexagonal Boron Nitride Nanosheets for Large-Area Graphene Electronics ", *Nano Lett. 12*:714-718 (2012).

Extended European Search Report, dated May 27, 2019, for corresponding European Patent Application No. 17736186.2, 13 pages.

\* cited by examiner

BORON NITRIDE MATERIAL AND METHOD OF PREPARATION THEREOF

CROSS-REFERENCE TO RELATED APPLICATION

This application claims the benefit of priority of Singapore patent application No. 10201600155R filed on 8 Jan. 2016, the content of which is incorporated herein by reference in its entirety for all purposes.

TECHNICAL FIELD

Various embodiments relate to a boron nitride material and method for preparing a boron nitride material.

BACKGROUND

Hexagonal boron nitride (h-BN) is also known as "white graphite" due to its honeycomb lattice structure which is similar to that for graphite. Being uniquely as an insulator in the two-dimensional (2D) family and coupled with its atomic smoothness and low density of surface dangling bonds, h-BN exhibits many outstanding properties and may be used as a substrate or dielectric material for other 2D materials such as graphene, and transition metal dichalcogenides (TMDs) for various high-performance 2D heterostructure devices and next-generation 2D heterostructure electronics, protective coatings, thermal interface material, and heat spreader. Due to its ability to withstand harsh conditions, h-BN may also be used as an ultrathin encapsulation layer to prevent device degradation for materials which are more susceptible to oxidation such as black phosphorus (BP).

Motivated by industrialization and the need for manufacturability, a variety of synthesis techniques to achieve atomically thin h-BN films over large distances have been explored, such as surface segregation method, solid source diffusion, ion-beam sputtering deposition (IBSD), pulsed-laser deposition (PLD), reactive magnetron sputtering, and molecular beam epitaxy (MBE).

Traditional B-containing gaseous precursors such as boron tribromide ($BBr_3$), boron trifluoride ($BF_3$), boron trichloride ($BCl_3$) and diborane ($B_2H_6$) together with N-containing gaseous precursors such as ammonia ($NH_3$) as feedstock gases have been explored for BN film growth. However, these B-containing compounds are highly toxic which limit their applications. Therefore, exploration and development of other alternatives with relatively low toxicity and cost as well as their corresponding processes for high-quality BN film growth remain an urgent need.

Ternary films containing composites of BN and graphene domains (BNC) may be prepared using additional C-containing precursor by mixing $CH_4$ into the reaction. Bulk amorphous, textured or nanocrystalline BNC films with thickness above 100 nm may be grown typically on Si substrates. Atomically thin highly crystalline films, however, cannot be deposited on Si or other dielectric substrates due to the lack of catalytic activity, epitaxial relation and different growth mechanisms. In this case, the growth of BN or BNC films is randomly oriented due to the uncontrolled nucleation and incomplete decomposition of the precursor.

In view of the above, there remains a need for an improved method to prepare a boron nitride material that overcomes or at least alleviates one or more of the abovementioned problems.

SUMMARY

In a first aspect, a method of preparing a boron nitride material is provided. The method comprises
 a) providing a substrate, and
 b) sublimating an amine borane complex onto the substrate to obtain the boron nitride material, wherein temperature at which the sublimating is carried out is varied to control composition of the boron nitride material formed.

In a second aspect, a boron nitride material prepared by a method according to the first aspect is provided.

BRIEF DESCRIPTION OF THE DRAWINGS

The invention will be better understood with reference to the detailed description when considered in conjunction with the non-limiting examples and the accompanying drawings, in which.

DETAILED DESCRIPTION

Figure 1A:
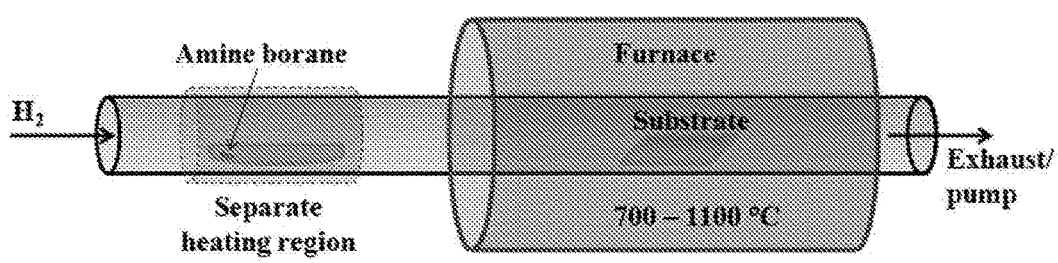
FIG. 1A is a schematic diagram depicting general layout of the chemical vapor deposition (CVD) setup for h-BN/h-BCN film growth. As used herein, h- denotes hexagonal, BN denotes boron nitride, while BCN denotes boron nitride doped with carbon.

Advantageously, composition of the boron nitride material formed may be controllably tuned using a method disclosed herein by varying temperature at which sublimating of an amine borane complex is carried out. For example, boron nitride material ranging from pristine boron nitride, to boron nitride doped with trace amounts of carbon, to a boron nitride composite having multiple domains of boron nitride and carbon may be prepared. The obtained films according to embodiments have optical band gaps (OBGs) ranging from about 6.13 eV to about 5.92 eV, and are highly transparent with nearly 100% transmittance throughout the infrared and visible spectra as determined by ultraviolet-visible spectroscopy (UV-vis). The method disclosed herein is highly versatile and may be used to prepare boron nitride material of different morphologies, such as boron nitride nanotubes (one dimensional), boron nitride films (two dimensional), and porous boron nitride structures (three dimensional) using an amine borane complex as a single source precursor. Notably, large area, atomically thin boron nitride films including monolayer single crystals and multilayer carbon-doped boron nitride films may be prepared. Chemical vapor deposition (CVD) may form a basis of the method. Due to its simplicity in design and operation, methods according to embodiments disclosed herein may be adopted and/or scaled up easily for mass production.

With the above in mind, various embodiments in a first aspect to a method of preparing a boron nitride material.

As used herein, the term "boron nitride material" refers to boron nitride as well as boron nitride containing carbon, such as boron nitride doped with trace amounts of carbon and a boron nitride composite having multiple domains of boron nitride and carbon.

Boron nitride has chemical formula BN, and exists in the cubic form (c-BN) and in the hexagonal form (h-BN). While the cubic form of boron nitride is analogous to diamond both in structure and hardness, with the hardness second only to diamond, hexagonal boron nitride resembles graphite in that it consists of stacked sheets with the component atoms arranged in a honeycomb pattern, and is also a good thermal conductor. h-BN has also been shown to be a superior substrate to silicon for graphene-based electrical devices. Unlike graphite, however, h-BN is an electrical insulator with a band gap of about 5.2 eV, and has a much higher thermal stability than graphite with a melting temperature near 3000° C.

In various embodiments, the boron nitride material comprises hexagonal boron nitride. Optionally, the boron nitride material contains carbon. For example, the boron nitride material may be hexagonal boron nitride, hexagonal boron nitride doped with carbon atoms, and/or a hexagonal boron nitride composite containing carbon as one or more domains within the boron nitride. As will be discussed below, the boron nitride material prepared using a method disclosed herein may also have different morphologies, such as boron nitride nanotubes (one dimensional), boron nitride films (two dimensional), and porous boron nitride structures (three dimensional).

The method according to various embodiments comprises providing a substrate, and sublimating an amine borane complex onto the substrate to obtain the boron nitride material. Advantageously, a single source precursor in the form of an amine borane complex may be used to prepare the boron nitride material as it contains the elements boron and nitrogen (B and N respectively) in a single molecule. In some embodiments, the amine borane complex may contain boron, carbon and nitrogen (B, C and N respectively) in a single molecule. As in the case for ammonia borane, these precursors decompose upon heating producing B- and N-containing derivatives (where the precursor contains B and N), or B-, C-, and N-containing derivatives (where the precursor contains B, C, and N). This compares favorably to state of the art methods where two or more precursor sources in the form of boron sources such as boron tribromide ($BBr_3$), boron trifluoride ($BF_3$), boron trichloride ($BCl_3$) and diborane ($B_2H_6$), and nitrogen sources such as melamine, urea or ammonia are used, as amine borane complex is relatively low-cost and is less toxic.

The amine borane complex may have general formula $R_3N.BX_3$, wherein X at each occurrence is independently selected from the group consisting of hydrogen and halogen, and R at each occurrence is independently selected from the group consisting of hydrogen, a substituted or unsubstituted $C_1$-$C_{20}$ alkyl, a substituted or unsubstituted $C_1$-$C_{20}$ alkoxy, a substituted or unsubstituted $C_2$-$C_{20}$ alkenyl, a substituted or unsubstituted $C_2$-$C_{20}$ alkynyl, a substituted or unsubstituted $C_3$-$C_{20}$ alicyclic group, a substituted or unsubstituted $C_5$-$C_{15}$ aryl, a substituted or unsubstituted $C_6$-$C_{30}$ alkyl-aryl, a substituted or unsubstituted $C_3$-$C_{20}$ heterocycle, a substituted or unsubstituted $C_4$-$C_{30}$ alkyl-heterocycle, a substituted or unsubstituted $C_5$-$C_{15}$ heteroaryl, —NR"R', —NR", —OR", —SR", —CN, —NO$_2$, —C(O)—R", —COOR", —C(O)—NR"R', —C(NR")—R', —SO$_2$—R", —(SO$_2$)—OR", —C(S)—R", and —C(S)—NR"R'; and R" and R' are independently selected from the group consisting of H, halogen, a substituted or unsubstituted $C_1$-$C_{20}$ alkyl, a substituted or unsubstituted $C_1$-$C_{20}$ alkoxy, a substituted or unsubstituted $C_2$-$C_{20}$ alkenyl, a substituted or unsubstituted $C_2$-$C_{20}$ alkynyl, and a substituted or unsubstituted $C_5$-$C_{15}$ aryl.

In present context, the term "aliphatic", alone or in combination, refers to a straight chain (i.e. linear) or branched chain hydrocarbon comprising at least one carbon atom. In certain embodiments, aliphatics are optionally substituted, i.e. substituted or unsubstituted. Aliphatics include alkyls, alkenyls, and alkynyls. Aliphatics include, but are not limited to, methyl, ethyl, propyl, isopropyl, butyl, isobutyl, tert-butyl, pentyl, hexyl, ethenyl, propenyl, butenyl, ethynyl, butynyl, propynyl, and the like.

The term "optionally substituted" or "substituted or unsubstituted" as used herein refers to a group in which none, one, or more than one of the hydrogen atoms have been replaced with one or more groups such as, but are not limited to, alkyl, heteroalkyl, haloalkyl, heterohaloalkyl, cycloalkyl, aryl, arylalkyl, heteroaryl, non-aromatic heterocycle, halogen, cyano, hydroxy, nitro, silyl, or amino group.

The term "linear", as used herein, refers to each of the carbon atom backbone chains having no branch point. The term "branched" means a chain of atoms with one or more side chains attached to it. Branching occurs by the replacement of a substituent, e.g. a hydrogen atom, with a covalently bonded substituent or moiety, e.g. an alkyl group.

The term "halogen", as used herein, refers to a member of the halogen family selected from the group consisting of fluorine, chlorine, bromine, and iodine.

In present context, the term "alkyl", alone or in combination, refers to a fully saturated aliphatic hydrocarbon. The alkyl may be linear or branched. In certain embodiments, alkyls are optionally substituted. In certain embodiments, an alkyl comprises 1 to 20 carbon atoms, for example 1 to 10 carbon atoms, wherein (whenever it appears herein in any of the definitions given below) a numerical range, such as "1 to 20" or "$C_1$-$C_{20}$", refers to each integer in the given range, e.g. "$C_1$-$C_{20}$ alkyl" means that an alkyl group comprising only 1 carbon atom, 2 carbon atoms, 3 carbon atoms, 4 carbon atoms, 5 carbon atoms, 6 carbon atoms, 7 carbon atoms, 8 carbon atoms, 9 carbon atoms, 10 carbon atoms, 11 carbon atoms, 12 carbon atoms, 13 carbon atoms, 14 carbon atoms, 15 carbon atoms, 16 carbon atoms, 17 carbon atoms, 18 carbon atoms, 19 carbon atoms, or 20 carbon atoms. Lower alkyl means 1 to 8, preferably 1 to 6, more preferably 1 to 4 carbon atoms.

Examples of the alkyl group include methyl, ethyl, 1-propyl or n-propyl ("n-Pr"), 2-propyl or isopropyl ("i-Pr"), 1-butyl or n-butyl ("n-Bu"), 2-methyl-1-propyl or isobutyl ("i-Bu"), 1-methylpropyl or s-butyl ("s-Bu"), and 1,1-dimethylethyl or t-butyl ("t-Bu"). Other examples of the alkyl group include 1-pentyl, 2-pentyl, 3-pentyl, 2-methyl-2-butyl, 3-methyl-2-butyl, 3-methyl-1-butyl, 2-methyl-1-butyl, 1-hexyl, 2-hexyl, 3-hexyl, 2-methyl-2-pentyl, 3-methyl-2-pentyl, 4-methyl-2-pentyl, 3-methyl-3-pentyl, 2-methyl-3-pentyl, 2,3-dimethyl-2-butyl and 3,3-dimethyl-2-butyl groups.

In present context, the term "alkoxy", alone or in combination, refers to an aliphatic hydrocarbon having an alkyl-O— moiety. The alkoxy may be linear or branched. In certain embodiments, alkoxy groups are optionally substituted. In various embodiments, the alkoxy comprises 1 to 20 carbon atoms, i.e. $C_1$-$C_{20}$ alkoxy. Examples of alkoxy groups include, but are not limited to, methoxy, ethoxy, propoxy, butoxy and the like.

In present context, the term "alkenyl", alone or in combination, refers to an aliphatic hydrocarbon having one or more carbon-carbon double-bonds, such as two or three carbon-carbon double-bonds. The alkenyl may be linear or branched. In certain embodiments, alkenyls are optionally substituted, i.e. substituted or unsubstituted. In certain embodiments, an alkenyl comprises 2 to 20 carbon atoms, such as 2 to 18, or 2 to 12, or 2-6 carbon atoms. "$C_2$-$C_{20}$ alkenyl" means that an alkenyl group comprising only 2 carbon atoms, 3 carbon atoms, 4 carbon atoms, 5 carbon atoms, 6 carbon atoms, 7 carbon atoms, 8 carbon atoms, 9 carbon atoms, 10 carbon atoms, 11 carbon atoms, 12 carbon atoms, 13 carbon atoms, 14 carbon atoms, 15 carbon atoms, 16 carbon atoms, 17 carbon atoms, 18 carbon atoms, 19 carbon atoms, or 20 carbon atoms. Lower alkenyl means 2 to 8, 2 to 6 or 2 to 4 carbon atoms. An allyl group having formula $H_2C=CH-CH_2-$ is an example of an alkenyl group. Further examples of alkenyls include, but are not limited to, ethenyl, propenyl, butenyl, 1,4-butadienyl, pentenyl, hexenyl, 4-methylhex-1-enyl, 4-ethyl-2-methylhex-1-enyl and the like.

In present context, the term "alkynyl", alone or in combination, refers to an aliphatic hydrocarbon having one or more carbon-carbon triple-bonds, such as two or three carbon-carbon triple-bonds. The alkynyl may be linear or branched. In certain embodiments, alkynyls are optionally substituted, i.e. substituted or unsubstituted. In certain embodiments, an alkynyl comprises 2 to 20 carbon atoms, such as 2 to 18, or 2 to 12, or 2 to 6 carbon atoms. "$C_2$-$C_{20}$ alkynyl" means that an alkynyl group comprising only 2 carbon atoms, 3 carbon atoms, 4 carbon atoms, 5 carbon atoms, 6 carbon atoms, 7 carbon atoms, 8 carbon atoms, 9 carbon atoms, 10 carbon atoms, 11 carbon atoms, 12 carbon atoms, 13 carbon atoms, 14 carbon atoms, 15 carbon atoms, 16 carbon atoms, 17 carbon atoms, 18 carbon atoms, 19 carbon atoms, or 20 carbon atoms. Lower alkynyl means 2 to 8, 2 to 6 or 2 to 4 carbon atoms. Examples of alkynyls include, but are not limited to, ethynyl, propynyl, butynyl, and the like.

In present context, the term "non-aromatic ring" refers to a group comprising a covalently closed ring that is not aromatic. The term "alicyclic" refers to a group comprising a non-aromatic ring wherein each of the atoms forming the ring is a carbon atom, and may be further classified into monocyclic and polycyclic (e.g., bicyclic and tricyclic) groups. Alicyclic groups may be formed of 3 to 20, or 3 to 12, or 3 to 8, or 3 to 6 carbon atoms, such as three, four, five, six, seven, eight, nine, or more than nine carbon atoms. In certain embodiments, alicyclics are optionally substituted, i.e. substituted or unsubstituted. In certain embodiments, an alicyclic comprises one or more unsaturated bonds, such as one or more carbon-carbon double-bonds. Alicyclics include cycloalkyls and cycloalkenyls. Examples of alicyclics include, but are not limited to, cyclopropane, cyclobutane, cyclopentane, cyclopentene, cyclopentadiene, cyclohexane, cyclohexene, 1,3-cyclohexadiene, 1,4-cyclohexadiene, cycloheptane, and cycloheptene.

In present context, the term "aryl" refers to an aromatic ring wherein each of the atoms forming the ring is a carbon atom. Aryl rings may be formed by five, six, seven, eight, nine, or more than nine carbon atoms. Aryl groups may be optionally substituted. For example, an aryl group may be 5- and 6-membered carbocyclic aromatic rings, such as, phenyl; bicyclic ring systems such as 7-12 membered bicyclic ring systems wherein at least one ring is carbocyclic and aromatic, selected, for example, from naphthalene, indane, and 1,2,3,4-tetrahydroquinoline; and tricyclic ring systems such as 10-15 membered tricyclic ring systems wherein at least one ring is carbocyclic and aromatic, for example, fluorene.

The term "alkyl aryl", as used herein, generally refers to a chemical substituent containing an alkyl group coupled to an aryl group or a substituted aryl group. The terms "aralkyl" and "aryl alkyl," as used alone or in combination herein, are species of alkyl as defined herein, and particularly refer to an alkyl group as defined above in which one hydrogen atom is replaced by an aryl group as defined above.

The terms "heterocyclic" or "heterocycle" or "heterocyclyl", as interchangeably used herein, refer to a ring selected from 4- to 12-membered monocyclic, bicyclic and tricyclic, saturated and partially unsaturated rings comprising at least one carbon atoms in addition to 1, 2, 3 or 4 heteroatoms, selected from oxygen, sulfur, and nitrogen. "Heterocycle" also refers to a 5- to 7-membered heterocyclic ring comprising at least one heteroatom selected from N, O, and S fused with 5-, 6-, and/or 7-membered cycloalkyl, carbocyclic aromatic or heteroaromatic ring, provided that the point of attachment is at the heterocyclic ring when the heterocyclic ring is fused with a carbocyclic aromatic or a heteroaromatic ring, and that the point of attachment can be at the cycloalkyl or heterocyclic ring when the heterocyclic ring is fused with cycloalkyl.

"Heterocycle" also refers to an aliphatic spirocyclic ring comprising at least one heteroatom selected from N, O, and S, provided that the point of attachment is at the heterocyclic ring. The rings may be saturated or have at least one double bond (i.e. partially unsaturated). The heterocycle may be substituted with oxo. The point of the attachment may be carbon or heteroatom in the heterocyclic ring. A heterocyle is not a heteroaryl as defined herein. Examples of the heterocycle include, but not limited to, (as numbered from the linkage position assigned priority 1) 1-pyrrolidinyl, 2-pyrrolidinyl, 2,4-imidazolidinyl, 2,3-pyrazolidinyl, 1-piperidinyl, 2-piperidinyl, 3-piperidinyl, 4-piperidinyl, 2,5-piperazinyl, pyranyl, 2-morpholinyl, 3-mo holinyl, oxiranyl, aziridinyl, fhiiranyl, azetidinyl, oxetanyl, thietanyl, 1,2-dithietanyl, 1,3-difhietanyl, dihydropyridinyl, tetrahydropyridinyl, thiomorpholinyl, thioxanyl, piperazinyl, homopiperazinyl, homopiperidinyl, azepanyl, oxepanyl, thiepanyl, 1,4-oxathianyl, 1,4-dioxepanyl, 1,4-oxafhiepanyl, 1,4-oxaazepanyl, 1,4-difhiepanyl, 1,4-fhiazepanyl and 1,4-diazepane 1,4-dithianyl, 1,4-azathianyl, oxazepinyl, diazepinyl, thiazepinyl, dihydrofhienyl, dihydropyranyl, dihydrofuranyl, tetrahydrofuranyl, tetrahydrothienyl, tetrahydropyranyl, tetrahydrothiopyranyl, 1-pyrrolinyl, 2-pyrrolinyl, 3-pyrrolinyl, indolinyl, 2H-pyranyl, 4H-pyranyl, 1,4-dioxanyl, 1,3-dioxolanyl, pyrazolinyl, pyrazolidinyl, dithianyl, difhiolanyl, pyrazolidinylimidazolinyl, pyrimidinonyl, 1,1-dioxo-thiomo holinyl, 3-azabicyco[3.1.0]hexanyl, 3-azabicyclo[4.1.0]heptanyl and azabicyclo[2.2.2]hexanyl.

The term "alkyl heterocycle", as used herein, generally refers to a chemical substituent containing an alkyl group coupled to a heterocycle or a substituted heterocycle.

In present context, the term "heteroaryl" refers to an aromatic heterocycle. Heteroaryl rings may be formed by five, six, seven, eight, nine, or more than nine atoms. Heteroaryls may be optionally substituted. Examples of heteroaryl groups include, but are not limited to, aromatic $C_5$-$C_{15}$ heterocyclic groups comprising one oxygen or sulfur atom or up to four nitrogen atoms, or a combination of one oxygen or sulfur atom and up to two nitrogen atoms, and their substituted as well as benzo- and pyrido-fused derivatives, for example, connected via one of the ring-forming carbon atoms.

In various embodiments, X is hydrogen.

R at each occurrence may independently a linear or branched, unsubstituted alkyl with 1 to 10 carbon atoms. More preferably, R at each occurrence is independently a linear or branched, unsubstituted alkyl with 1 to 5 carbon atoms. In specific embodiments, R is methyl.

Examples of an amine borane complex include, but are not limited to, amino borane ($H_2B=NH_2$), borazine ($B_3N_3H_6$), ammonia borane ($H_3B$—$NH_3$), methylamine borane ($CH_3$)$H_2N$—$BH_3$, dimethylamine borane (($CH_3$)$_2HN$—$BH_3$), and trimethylamine borane (($CH_3$)$_3N$—$BH_3$), and combinations thereof. The above-mentioned amine borane complexes, such as ammonia borane and trimethylamine borane (TMAB, ($CH_3$)$_3$N.$BH_3$), contain the elements B and N in a single molecule and may be used herein as a single source precursor for preparing boron nitride. In some embodiments, the amine borane complex contains B, N and C in a single molecule, and may be used as a single source precursor for preparing the boron nitride material, which may be boron nitride, boron nitride doped with trace amounts of carbon, and/or a boron nitride composite having multiple domains of boron nitride and carbon. Advantageously, such amine borane complexes, which may be much less toxic and which may have intrinsic 1:1 B/N stoichiometry, may be used to prepare large-sized single-crystal domains which exceeds 100 μm in dimensions.

In some embodiments, the amine borane complex comprises trimethylamine borane. Use of trimethylamine borane may be preferred due to its lower cost as compared to ammonia borane, which provides for its attractiveness from a manufacturing perspective.

The amine borane complex may be sublimed onto the substrate to obtain the boron nitride material. As used herein, the term "sublimation" refers, as is conventional, to a direct solid-gas phase change. The material may for example, change from a solid phase directly to a gaseous phase without going through a liquid phase. The vaporized BN precursors may be directed onto the substrate, where they may be absorbed into the bulk of the substrate such as a metallic substrate and subsequently precipitated out to form a layer of atomically thin film (including monolayer) BN film on various catalytic metals such as Cu, Ni, and Pt upon cooling. Large-sized single-crystal domains which exceeds 100 μm in dimensions may be prepared.

Temperature at which the sublimating is carried out may be varied to control composition of the boron nitride material formed. Generally, to form boron nitride doped with about 0 wt % to about 5 wt % carbon, sublimating the amine borane complex may be carried out at a temperature of less than about 100° C. Advantageously, under such processing conditions, the boron nitride material may comprise one or more single-crystal domains, where each of the one or more single-crystal domains may have a maximal dimension of 100 am or more.

In various embodiments, sublimating the amine borane complex is carried out at a temperature of about 50° C. or less, preferably about 40° C. or less. For example, sublimating the amine borane complex may be carried out at a temperature in the range of about 15° C. to about 50° C., such as about 25° C. to about 50° C., about 35° C. to about 50° C., about 15° C. to about 40° C., about 15° C. to about 30° C., about 25° C. to about 40° C., or about 20° C. to about 35° C. In some embodiments, sublimating the amine borane complex is carried out at ambient temperature, where the term "ambient temperature" as used herein refers to a temperature of between about 20° C. to about 40° C.

In carrying out the sublimation at this temperature range, the boron nitride material that is formed may consists essentially of boron nitride. In some embodiments, the boron nitride material consists only of boron nitride. By the term "consists essentially", this means that the boron nitride material may contain trace amounts of other substances, which may arise, for example, from carbon that is present in the amine borane complex and/or during the preparation process. The trace amounts of other substances may be present in an amount of less than 5 atomic %, such as less than 2 atomic %, preferably less than 1 atomic %, even more preferably less than 0.5 atomic %.

In various embodiments, sublimating the amine borane complex is carried out at a temperature greater than about 50° C. and less than about 100° C. In some embodiments, sublimating the amine borane complex is carried out at a temperature of 60° C. or more, and less than about 100° C. For example, sublimating the amine borane complex may be carried out at a temperature in the range of about 51° C. to about 99° C., such as about 55° C. to about 95° C., about 60° C. to about 95° C., about 75° C. to about 95° C., about 55° C. to about 80° C., about 55° C. to about 75° C., or about 55° C. to about 65° C.

In carrying out the sublimation at this temperature range, the boron nitride material that is formed may be boron nitride doped with trace amounts of carbon. By the term "doped", it refers to an additive or element which is added to a material in low concentrations to alter a physical or chemical property of the material. Amount of carbon in the boron nitride material may be about 2 wt % to about 5 wt % carbon, such as about 3 wt % to about 5 wt % carbon, about 4 wt % to about 5 wt % carbon, about 2 wt % to about 4 wt % carbon, about 2 wt % to about 3 wt % carbon, or about 3 wt % to about 4 wt % carbon.

Figure 1B:
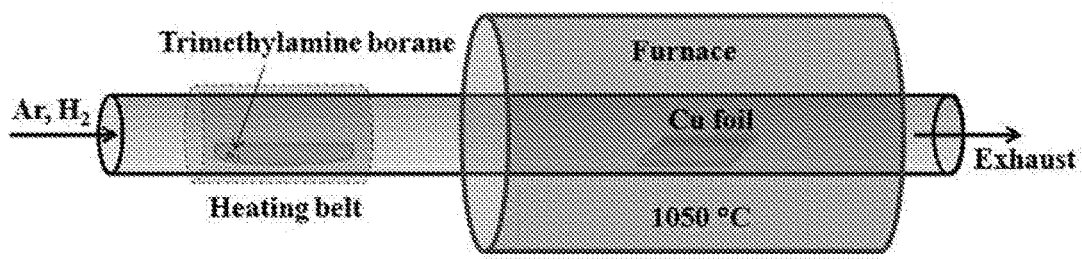
FIG. 1B is a schematic diagram depicting layout of the chemical vapor deposition (CVD) setup for h-BN/h-BCN film growth according to an embodiment. In the embodiment shown, the input gas comprises argon (Ar) and hydrogen gas ($H_2$), the amine borane is trimethylamine borane (TMAB), the separate heating region is a heating belt, the substrate is copper (Cu) foil, temperature is at 1050° C., and outlet of the furnace is connected to an exhaust.
Figure 1C:
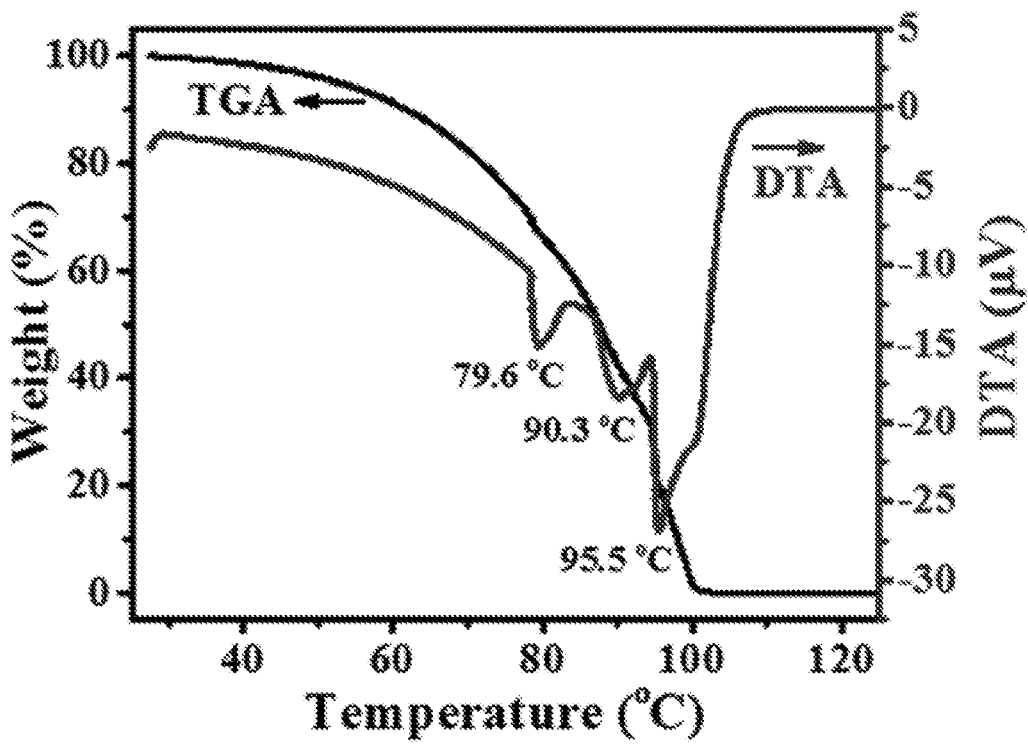
FIG. 1C is a graph showing thermogravimetric analysis (TGA) and differential thermal analysis (DTA) spectra of TMAB under an inert atmosphere.
Figure 1D:
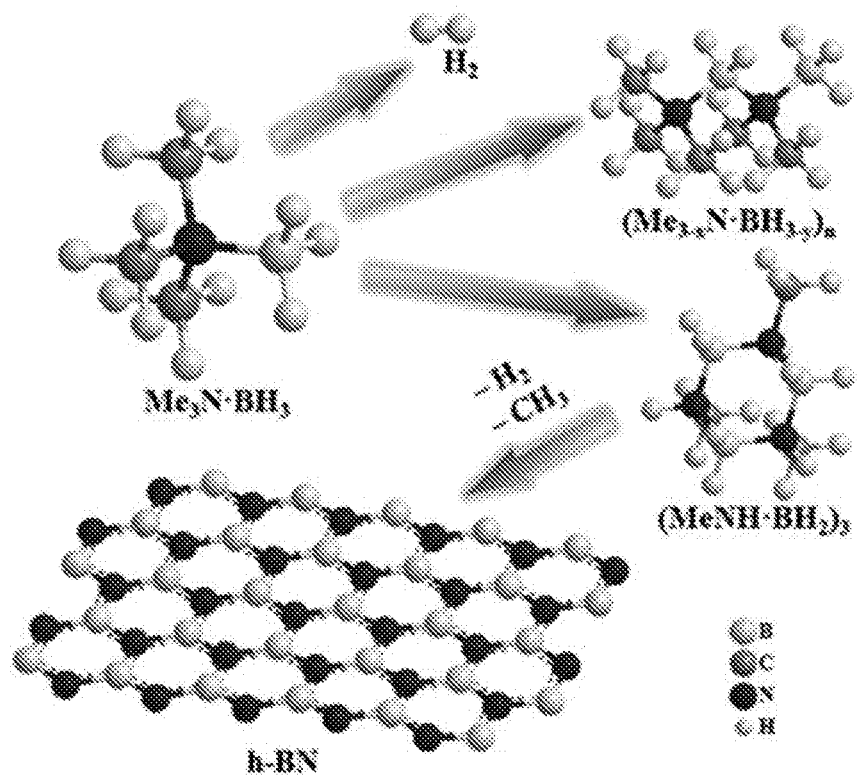
FIG. 1D is a schematic diagram showing possible reaction pathways for the formation of h-BN by using TMAB as the single-source precursor.
Figure 1E:
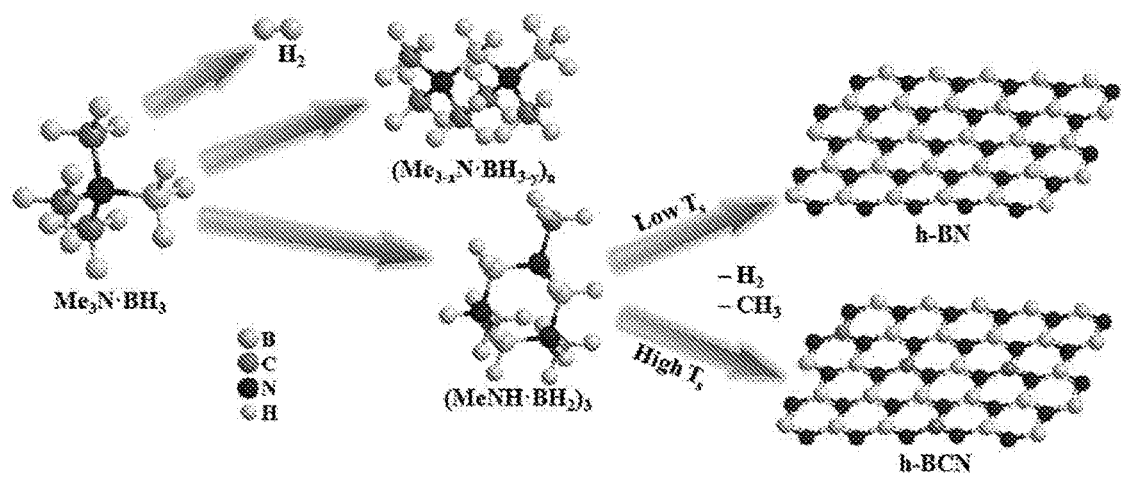
FIG. 1E is a schematic diagram showing possible reaction pathways for the formation of h-BN and h-BCN by using TMAB as the single-source precursor.
Figure 1F:
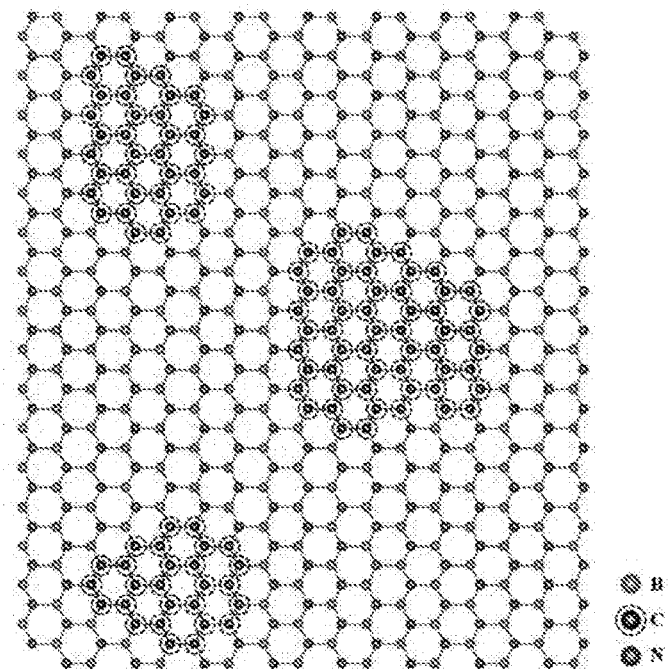
FIG. 1F is a schematic diagram showing atomic structure of BNC film. As used herein, BNC denotes boron nitride composite having one or more domains of boron nitride (BN) and carbon (C).
Figure 1G:
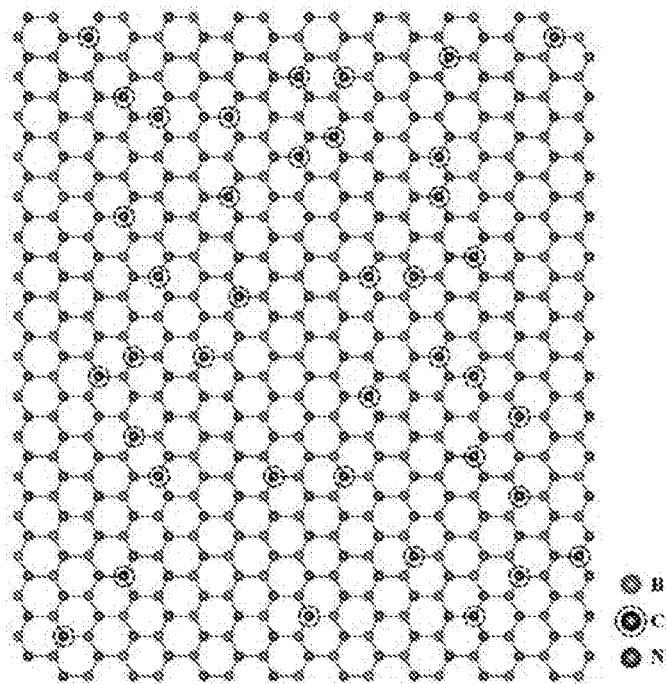
FIG. 1G is a schematic diagram showing atomic structure of BCN film.

As depicted in FIG. 1G, for example, the carbon may be randomly interdispersed within the boron nitride material. This is different from the structure shown in FIG. 1F where the carbon is present as domains within the boron nitride.

In embodiments, the boron nitride material is a boron nitride composite comprising one or more domains of boron nitride and carbon, and may have the structure depicted in FIG. 1F. The boron nitride material may be obtained by sublimating the amine borane complex at a temperature of about 100° C. or more, which may be in the range of about 100° C. to about 200° C., such as about 100° C. to about 200° C., or about 100° C. to about 150° C.

As mentioned above, the boron nitride material prepared using a method disclosed herein may have different morphologies, such as boron nitride nanotubes (one dimensional), boron nitride films (two dimensional), and porous boron nitride structures (three dimensional). This may be effected depending on the type of substrate used.

For example, in embodiments wherein the boron nitride material is a boron nitride nanotube, the substrate may be one that has a layer of a metal that is in discrete particulate form and arranged on a support. Accordingly, providing the substrate may comprise providing a substrate having a layer of a metal in discrete particulate form arranged on a support.

The layer of metal arranged on the support may be a thin layer having a thickness in the range of about 0.5 nm to about 5 nm, such as about 1 nm to about 5 nm, about 2 nm to about 5 nm, about 3 nm to about 5 nm, about 0.5 nm to about 4 nm, about 0.5 nm to about 3 nm, or about 2 nm to about 4 nm. At such a thickness, the layer of metal may be present in the form of islands on a surface of the substrate. As used herein, the term "island" refers to a distinct area of a layer having a defined geometric shape that is protruding from the layer. The layer of metal may be formed by an island growth mechanism, where the metal islands on the substrate are capable of coalescing to form a continuous film.

The metal may be selected from Group 3 to Group 12 of the Periodic System of Elements. In various embodiments, the metal is a transition metal. Examples of transition metal include, but are not limited to, scandium (Sc), titanium (Ti), vanadium (V), chromium (Cr), manganese (Mn), iron (Fe), cobalt (Co), nickel (Ni), copper (Cu), zinc (Zn), and alloys thereof. In some embodiments, the metal is selected from the group consisting of nickel, iron, alloys thereof, and combinations thereof.

The support may be of any suitable material, such as glass, metals, ceramics, organic polymer materials, plastics, semiconductors, to name only a few. Further, composites of these materials may also be used as the substrate. In specific embodiments, the substrate is a glass substrate.

Figure 15A:
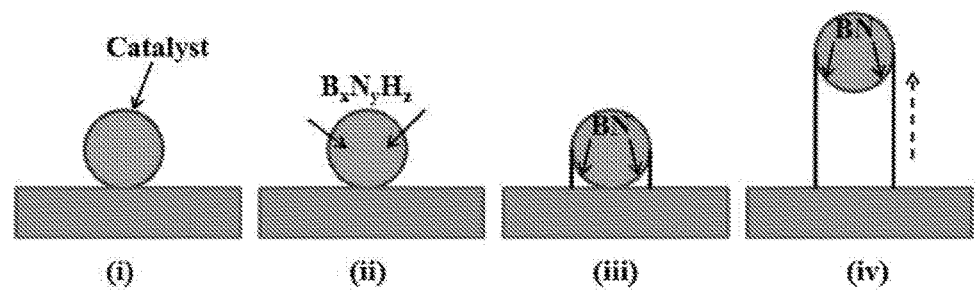
FIG. 15A is a schematic diagram showing growth mechanism of BN-nanotubes by tip-growth.
Figure 15B:
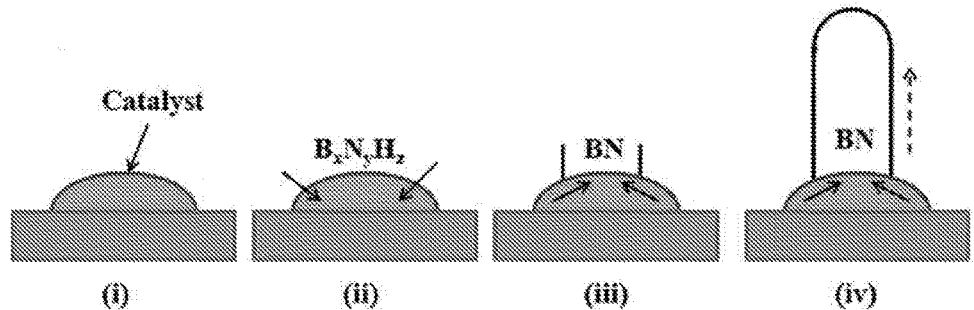
FIG. 15B is a schematic diagram showing growth mechanism of BN-nanotubes by root-growth.

During sublimation of the boron nitride complex, the boron nitride precursors may be absorbed into the layer of metal and form nanotubes via a tip-growth mechanism and/or a root-growth mechanism such as that depicted respectively in FIG. 15A and FIG. 15B. As mentioned above, temperature at which the sublimating is carried out may be varied to control composition of the boron nitride material formed.

In addition to, or apart from the above mentioned, a boron nitride nanotube may be prepared using a template-assisted approach by, for example, providing a substrate comprising one or more carbon nanotubes, and sublimating an amine borane complex onto the one or more nanotubes to obtain the boron nitride nanotube(s). The one or more nanotubes may function as a template, hence by sublimating the amine borane complex onto the nanotube(s), the boron nitride precursors may be deposited conformally on a surface of the nanotube(s), so that the boron nitride material assumes the morphological structure of the nanotube(s) template to form boron nitride nanotube(s). As disclosed herein, temperature at which the sublimating is carried out may be varied to control composition of the boron nitride material formed.

The one or more carbon nanotubes may be removed by annealing the substrate following sublimating of the amine borane complex onto the substrate in an environment containing oxygen at a temperature in the range of about 400° C. to about 700° C. For example, annealing the substrate may be carried out in an environment containing oxygen at a temperature in the range of about 500° C. to about 700° C., about 600° C. to about 700° C., about 400° C. to about 600° C., about 400° C. to about 500° C., about 500° C. to about 600° C., or about 450° C. to about 650° C.

In addition to or apart from boron nitride nanotubes, methods according to embodiments disclosed herein may be used to prepare a porous boron nitride material. This may be carried out by, for example, providing a substrate having a layer of a metal arranged on a porous support, and sublimating an amine borane complex onto the substrate to obtain the boron nitride material. Temperature at which the sublimating is carried out may be varied to control composition of the boron nitride material formed. Examples of metal that may be used have already been discussed above. Upon forming the boron nitride material on the substrate, the substrate may be removed by subjecting the substrate to an etching process.

In various embodiments, the boron nitride material may be a boron nitride film. The boron nitride film may be prepared by providing a substrate having a layer of a metal in continuous form arranged on a support, and sublimating an amine borane complex onto the substrate to obtain the boron nitride material. Temperature at which the sublimating is carried out may be varied to control composition of the boron nitride material formed. Examples of metal that may be used have already been discussed above.

Shape and structure of the substrate may be arbitrarily selected, and is not limited to a planar surface. For example, the substrate may have a non-planar shape, or be in the form of a product. The substrate may be removed by subjecting the substrate to an electrochemical delamination process following sublimating of the amine borane complex onto the substrate. This may allow transferring of the boron nitride film to another support.

Thickness of the film may be controlled by varying the sublimation time period. Advantageously, the boron nitride material may be present as a monolayer on the substrate, which may be formed, for example, by sublimating the amine borane complex onto the substrate for a time period in the range from about 5 minutes to about 20 minutes, such as about 10 minutes to about 20 minutes, about 15 minutes to about 20 minutes, about 5 minutes to about 15 minutes, about 5 minutes to about 10 minutes, or about 10 minutes to about 15 minutes.

In some embodiments, the substrate may be annealed in an inert environment at a temperature of about 700° C. or more, preferably in the range of about 700° C. to about 1100° C., to remove surface oxide that may be present on the substrate. In such embodiments, a suitable substrate may be one that is able to withstand temperatures of at least 700° C.

Various embodiments refer in a second aspect to a boron nitride material prepared by a method according to the first aspect.

As mentioned above, composition of the boron nitride material formed may be controllably tuned by varying temperature at which sublimating of an amine borane complex is carried out. For example, boron nitride material ranging from pristine boron nitride, to boron nitride doped with trace amounts of carbon, to boron nitride having multiple domains of boron nitride and carbon may be prepared.

The boron nitride material may exhibit a transmittance of at least 80% in the wavelength region from 350 nm to 750 nm. The term "transmittance" as used herein refers to intensity of radiation transmitted through a material over that of the incident radiation, and which is expressed as a percentage. The wavelength region from 350 nm to 750 nm corresponds to visible light range of the electromagnetic spectrum. In various embodiments, the coating exhibits a transmittance of at least 80%, at least 85%, at least 87%, or at least 90% in the wavelength region from 350 nm to 750 nm.

The boron nitride material may have optical band gaps (OBGs) in the range of about 6.13 eV to about 5.92 eV. The term "band-gap" as used herein refers to a difference in energy between the top of the valence band to the bottom of the conduction band of a material, which amounts to the minimum amount of energy for an electron to jump or transition from a valence band to a conduction band. The term "optical band-gap" refers to photons assisting the electrons to move from valence band to conduction band, which is important as it determines the portion of the electromagnetic spectrum a material absorbs. With a slight increase in C doping concentration of about 2% to about 5%, a small decrease in OBG may take place.

The boron nitride material disclosed herein may be used as a dielectric substrate and encapsulation material for high-performance two-dimensional (2D) heterostructure devices.

The invention has been described broadly and generically herein. Each of the narrower species and subgeneric groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples. In addition, where features or aspects of the invention are described in terms of Markush groups, those skilled in the art will recognize that the invention is also thereby described in terms of any individual member or subgroup of members of the Markush group.

EXPERIMENTAL SECTION

Due to their exceptional chemical and thermal stabilities as well as electrically insulating property, atomically thin hexagonal boron nitride (h-BN) films have been identified as a promising class of dielectric substrate and encapsulation material for high-performance two-dimensional (2D) heterostructure devices.

Herein, a facile chemical vapor deposition (CVD) synthesis of large-area atomically thin h-BN including monolayer single crystals and C-doped h-BN (boron carbonnitride, h-BCN) films utilizing amine borane complexes, such as trimethylamine borane (TMAB) which is relatively low-cost and commercially available, as a single-source precursor is reported for the first time according to various embodiments. Thin BN films including monolayer single crystals may be prepared using a method disclosed herein, and C-doping concentration in the film may be controllably tuned by controlling sublimation temperature of the precursor.

In embodiments, the amine borane complex may have general formula $R_3N.BX_3$, where each X is independently selected from the group consisting of hydrogen and halide, and each R independently selected from the group consisting of hydrogen, alkyl, allyl, alkenyl, alkynyl, alkylaryl, arylalkyl, phenyl, alkene and alkyne.

TABLE 1 shows the comparison of the prices of various amine borane complexes from Sigma-Aldrich. As compared to ammonia borane which is most commonly used to grow BN, other amine borane complexes are about 10 times cheaper. Hence, methods according to embodiments disclosed herein may significantly reduce the cost of production of 1D, 2D and 3D structures of BN and BCN, and are also less hazardous and more environment-friendly.

TABLE 1

Price comparison of various amine borane complexes (from Sigma-Aldrich)

| Amine borane complex | Quantity (g) | Price (S$) |
|---|---|---|
| Ammonia borane ($NH_3$—$BH_3$) | 100 | 4690.00 |
| Dimethylamine borane (($CH_3$)$_2$NH•$BH_3$) | 100 | 430.50 |
| Trimethylamine borane (($CH_3$)$_3$N•$BH_3$) | 100 | 608.00 |
| Triethylamine borane (($C_2H_5$)$_3$N•$BH_3$) | 100 | 483.50 |
| Borane tert-butylamine (($CH_3$)$_3$CNH$_2$•$BH_3$) | 100 | 324.50 |

The highly crystalline film provides better film uniformity, mechanical property, and thermal conductivity as compared to amorphous and nanocrystalline films. Importantly, pristine 2D h-BN films with a wide band gap of about 6.1 eV may be achieved by limiting the sublimation temperature of TMAB at 50 or less ° C., while C dopants may be introduced to the h-BN films when the sublimation temperature is further increased. The h-BCN thin films displayed band gap narrowing effects as identified by an additional shoulder at 205 nm observed in their absorbance spectra. Presence of N—C bonds in the h-BCN structures with a doping concentration of about 2 to 5% is confirmed by X-ray photoelectron spectroscopy. The inclusion of low C doping in the h-BN films is expected to result in constructive enhancement to its mechanical properties without significant alteration to its electrically insulating nature.

Figure 1H:
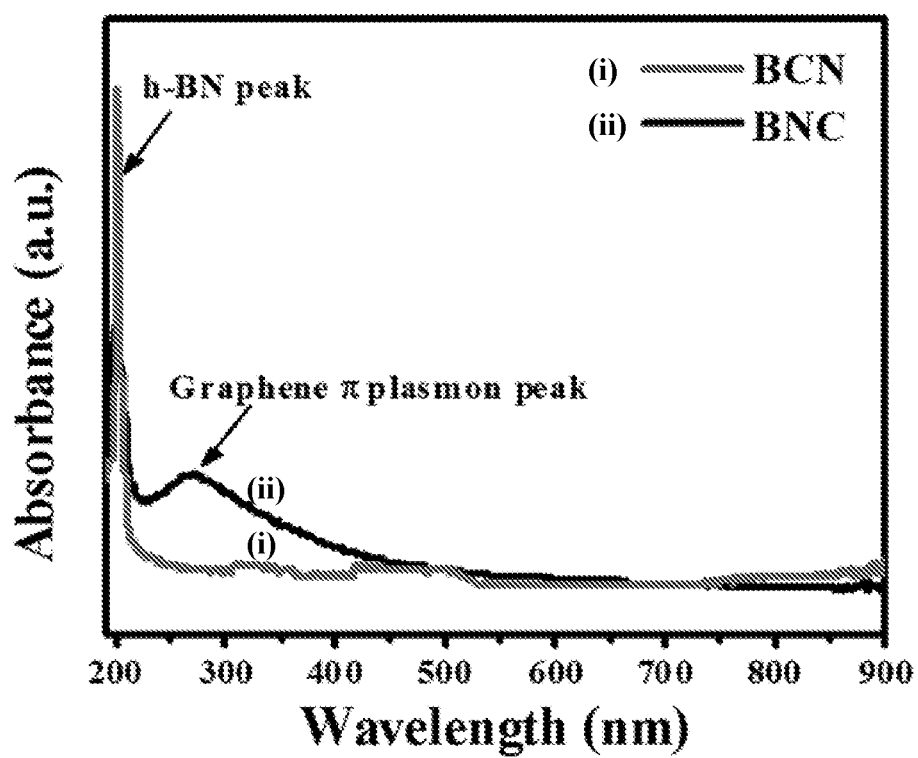
FIG. 1H is a graph showing UV-visible absorbance spectra of (i) BCN and (ii) BNC films.

The BCN films that are produced using this technique are different from those containing composites of BN and C domains (BNC films). FIG. 1F and FIG. 1G show schematic illustrations of the atomic configuration of BNC and BCN films, respectively. For BNC films, they consist of clusters of C domains embedded within the BN film while for BCN films, the C atoms are substituted with either a B or N atom in a BN matrix. Hence, the properties of BNC and BCN films are entirely different as BNC would contain both the separate properties arising from the individual BN and graphene domains. This is evident in its bandgap and optical properties. As shown in FIG. 1H, a typical BNC film has two separate absorption peaks arising from graphene and BN at 270 nm and 202 nm, respectively, which makes tunability to its bandgap and optical properties difficult. On the other hand for BCN films, a slight broadening of the BN peak is observed at 205 nm which will further increase with more C doping. Hence, such films would enable a more versatile tunability to its electronic, mechanical and magnetic properties as C is doped into the BN films.

Example 1: Synthesis of h-BN and h-BCN Films (Embodiment 1)

Copper (Cu) foils (Alfa Asear, product no. 13382, 25 am thick) were used as growth substrates for the h-BN and h-BCN films. Prior to growth, the Cu foil was first dipped into dilute nitric acid for a few seconds, followed by rinsing with DI water to remove the coatings on the Cu surface. The Cu foil was then loaded into a 1 inch quartz tube under a constant $Ar/H_2$ flow of 200:20 sccm. The furnace was ramped up to 1050° C. in 40 min and kept constant for another 30 min to anneal the Cu and to remove the surface oxide.

After annealing, 10 mg of trimethylamine borane complex (Alfa Asear, product no. L14994, 97%), which was placed in a ceramic boat outside the heating zone, was heated at a specified temperature to commence the film growth. The growth time for monolayer h-BN single-crystal domains into a continuous film range from 5 to 20 min, while for h-BCN films, full coverage films are obtained after 5 min of growth. After growth, the lid of the furnace was lifted for quick cooling.

Example 2: Transfer Process (Embodiment 1)

An electrochemical delamination process was used to transfer the films onto $SiO_2$/Si and quartz substrates. First, the as-grown h-BN or h-BCN film on Cu was spin coated with polymethyl methacrylate (PMMA) at 3000 rpm for 30 s. 1 M of NaOH was used as the electrolyte. A Pt foil was used as the anode and the spin coated sample was used as the cathode. A constant voltage of 5 V was applied until the PMMA coated sample was completely detached from the Cu.

The sample was then rinsed in DI water for several times and transferred onto a desired substrate. The as-transferred sample was baked at 50° C. until it was completed dry. Finally, the PMMA was removed by submerging the sample in acetone for several hours.

Example 3: Characterization (Embodiment 1)

Thermogravimetric analysis (TGA, Shimadzu DTG-60H thermal analyzer) was used to determine the thermal decomposition profile of TMAB. The TGA measurement was carried out under a constant flow of nitrogen gas (100 mL/min) and heated from 25 to 125° C. at a heating rate of 2° C./min.

Scanning electron microscopy (SEM, LEO 1550 Gemini) images were taken directly on the as-grown h-BN and h-BCN films on Cu substrates.

Atomic force microscopy (AFM, Cypher scanning probe microscope) was done using tapping mode to measure the thickness of the transferred h-BN and h-BCN films on $SiO_2$/Si substrates.

Raman spectroscopy with laser excitation wavelength of 532 nm (Witec) was done at room temperature to determine the crystal structure of the transferred films on $SiO_2$/Si substrates.

Fourier transform infrared spectroscopy (FT-IR, IRPrestige-21 spectrometer) was performed using the transferred h-BN film on a double-sided polished Si wafer within the wavenumber ranging from 4000 to 400 $cm^{-1}$.

Transmission electron microscopy (TEM, Tecnai G2 F20 X-Twin) equipped with electron energy-loss spectroscopy (EELS) was operated with an acceleration voltage of 200 kV to determine the atomic structure and elemental composition of the h-BN film.

X-ray photoelectron spectroscopy (XPS, VG ESCA 220i-XL Imaging) was used to determine the elemental composition and bonding structures of the as-grown films on Cu.

Ultraviolet-visible spectroscopy (UV-vis, Shimadzu UV-2450) was used to extract the optical band gaps (OBGs) of the transferred films on quartz substrates.

Example 4: Results and Discussion (Embodiment 1)

FIG. 1A is a schematic diagram depicting general layout of the chemical vapor deposition (CVD) setup for h-BN/h-BCN film growth. Both low and atmospheric pressure are suitable for the growth. The precursor, amine borane complex ($R_3N.BX_3$), where X is hydrogen and/or halide, and R is hydrogen, alkyl, allyl, alkenyl, alkynyl alkylaryl, arylalkyl, phenyl, alkene and/or alkyne, may be loaded near the inlet of the tube, or at a separate chamber, away from the heating zone of the furnace.

Suitable substrates may include materials which are able to withstand a growth temperature of 700° C. to 1100° C. under an inert atmosphere, such as, but not limited to, metal foils and foams (such as Cu, Ni, or Pt) and other nanostructured materials (such as carbon nanotubes or graphene). $H_2$ and inert gases such as Ar, may be used as the carrier gas.

An optional annealing process may be carried out on metal substrates to enlarge the grain sizes and remove the native oxide. When temperature in the furnace reaches 700 to 1100° C., growth of the film may be initiated by heating the precursor at an elevated temperature depending on its melting point. Flow of the vaporized precursor may be directed into the deposition chamber to form a film on the substrate. The high growth temperature may be required for the precursor to decompose into active BN or BCN species in order to achieve a crystalline film.

For metallic substrates, the BN or BCN species may be absorbed into the bulk of the metallic substrate and subsequently precipitated out to form a layer of atomically thin film upon cooling. For other starting substrates such as carbon nanotubes and graphene, the BN or BCN layers may be coated conformally onto these structures.

Highly crystalline nature of the attained BN and BCN films may be achieved due to lattice-matching properties and epitaxial relation of the metal substrates (such as Cu and Ni) and graphene or carbon nanotubes to the BN and BCN layers. Various embodiments disclosed herein demonstrate that BN and BCN structures with different dimensionality/morphological structure, which may in turn depend on the underlying substrate, may be controllably achieved with different composition of C-doping by tuning sublimation temperature of the precursor. Film thickness may be varied with growth time and the quantity of amine borane complex used.

FIG. 1B shows a schematic layout of the atmospheric pressure (AP) CVD system used for the growth of monolayer h-BN single crystals as well as large-area (over centimeter-scale) atomically thin polycrystalline h-BN and h-BCN films formed by coalescence of multiple single-crystal domains.

TMAB, one of amine borane complexes, was used as a single-source precursor for all B, C and N elements in the films and Cu foils are used as catalytic substrates. Compared to AB, TMAB has a lower melting temperature due to the presence of the alkyl groups. Therefore, growth of the h-BN films may be realized by sublimating TMAB at a relatively lower sublimation temperature ($T_s$).

FIG. 1C shows a thermogravimetric analysis (TGA) and its corresponding differential thermal analysis (DTA) spectra of TMAB under an inert atmosphere. A continuous weight loss occurred up to 100° C. where TMAB was fully decomposed, with three endothermic peaks centered at 79.6, 90.3 and 95.5° C., respectively, corresponding to the thermal decomposition/melting of TMAB with the loss of volatile gaseous including molecular hydrogen ($H_2$) and various dehydrogenated derivatives $(Me_{3-x}N.BH_{3-y})_n$.

Figure 2:
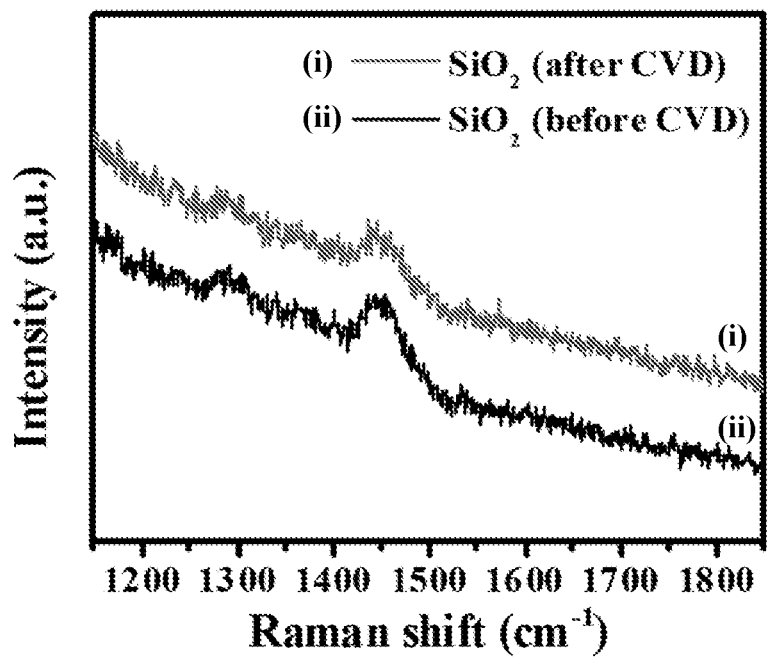
FIG. 2 is a graph showing Raman spectra of the as-prepared samples before ((ii), black trace) and after ((i), red trace) h-BN CVD growth process on $SiO_2$ substrates using TMAB as the precursor. The peak at about 1450 $cm^{-1}$ was attributed to the third order Si transverse optical (TO) phonon mode. No other peak was detected indicating that no film was grown on the $SiO_2$ surface after CVD process.

Possible dehydrogenation routes of TMAB and the pathway to form h-BN films are shown in FIG. 1D. The dehydrogenation process may begin across the B—N bonds and the generated gaseous products of the TMAB decomposition may further polymerize and chemically transform inside the hot zone of the CVD tube. Cross-linking may then start occurring from the B sites which may lead to formation of trimeric aminoborane, $(MeNH.BH_2)_3$. Further intermolecular reactions of this compound through dehydrocoupling form cyclic chains with the framework of h-BN, and 2D h-BN film may be produced by further cross-linking of these chains at above 1000° C. It was noted that cleavage of N—C bond was favored over B—N bond due to its relatively weaker chemical bond. Meanwhile, the presence of $H_2$ gas may further aid the cleavage of N—C bonds, which may result in volatile $CH_{3-x}$ during formation of h-BN at high temperatures. This may explain the negligible or small amount of C composition that existed in the as-prepared films. The inventors also noted that a catalytic substrate such as Cu was required for this formation process to enhance the dehydrogenation reaction as evident by the lack of h-BN film growth on $SiO_2$/Si substrates under the same growth conditions (FIG. 2).

Figure 3A:
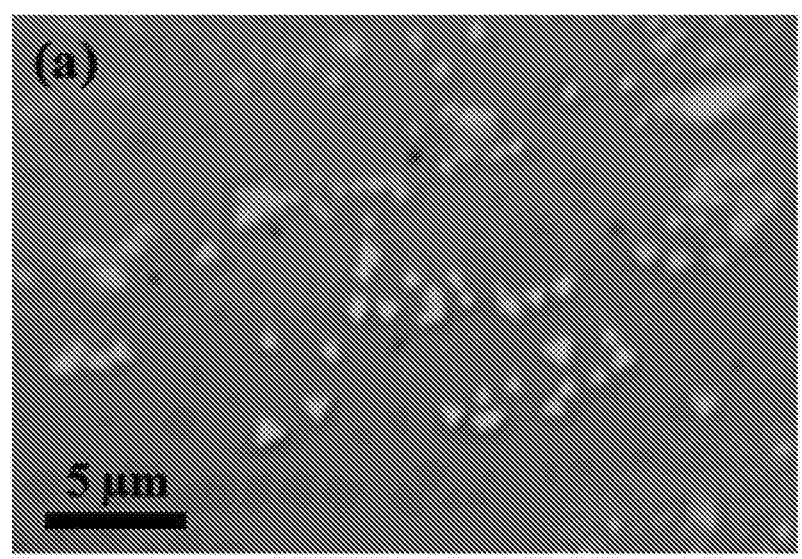
FIG. 3A is an optical image of an air-oxidized h-BN/Cu. The brighter and the darker contrasts represent h-BN domains and oxidized Cu, respectively.
Figure 3B:
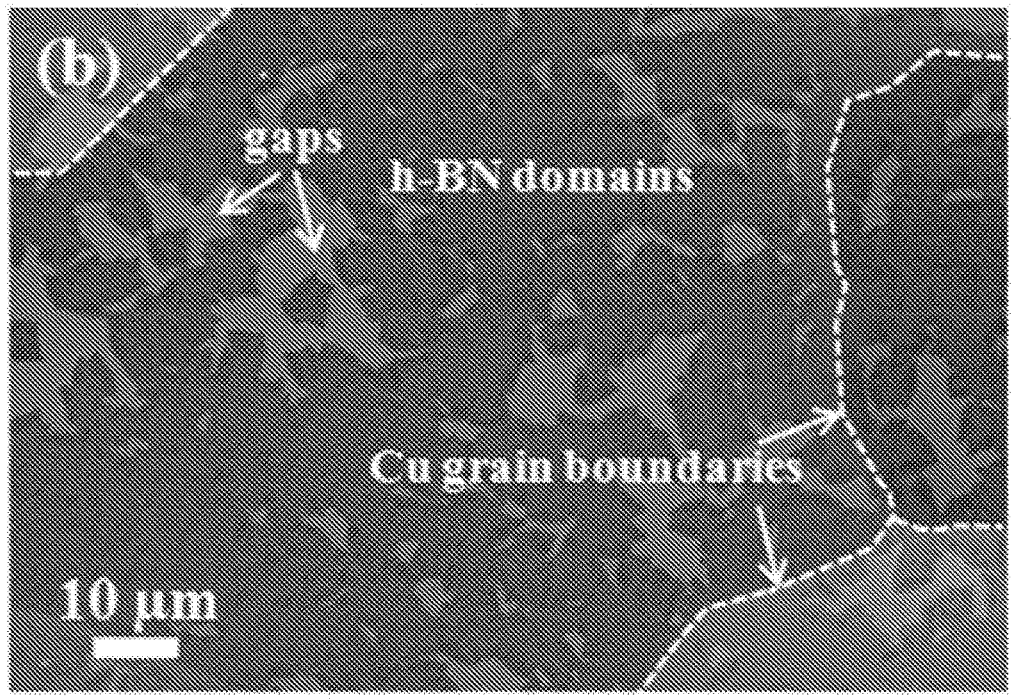
FIG. 3B is a scanning electron microscopy (SEM) image of the as-grown partially continuous h-BN film on a Cu substrate.

FIG. 3A shows an optical image of an air-oxidized h-BN/Cu foil to reveal the existence of h-BN domains during the initial stage of growth before they coalesced into a continuous film. As h-BN was highly resistant to oxidation, the regions that were covered by the h-BN domains retained the same optical contrast as a non-oxidized Cu (brighter contrast) and the triangular shaped h-BN domains may be easily identified on the oxidized Cu. FIG. 3B shows a typical SEM image of a partially continuous h-BN film formed by coalescing with neighboring domains. These single-crystal domains were transferred onto various substrates including 285 nm $SiO_2$/Si, double-sided polished Si, quartz and TEM grids for further AFM, FT-IR, UV-vis and TEM characterization, respectively.

Figure 3C:
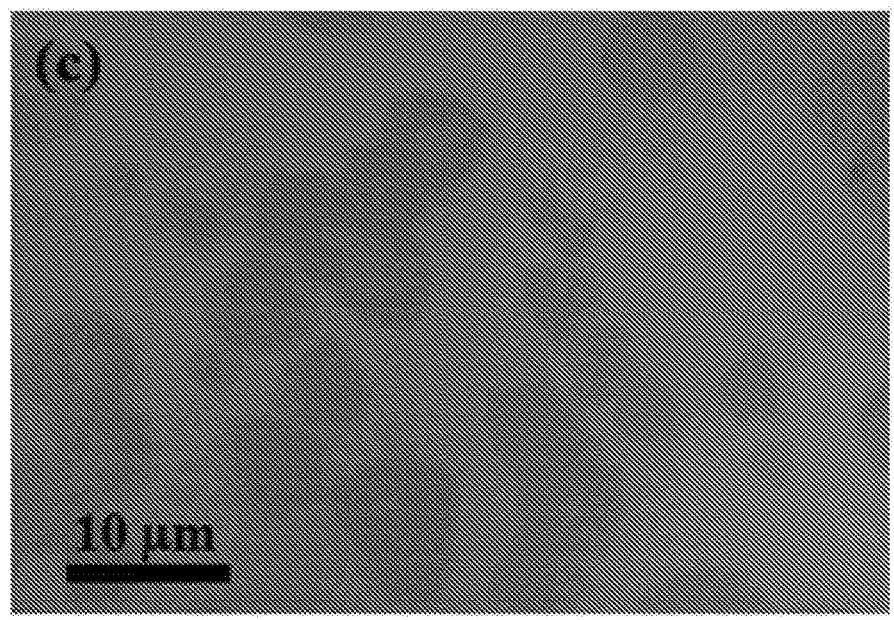
FIG. 3C is an optical image of the transferred h-BN domains on $SiO_2$/Si substrate.
Figure 3D:
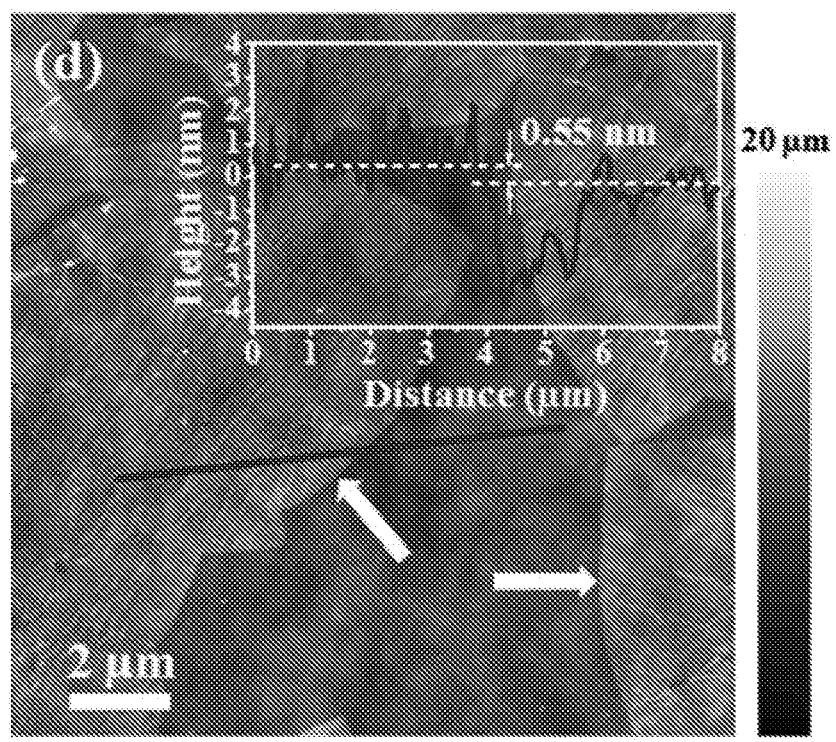
FIG. 3D is an atomic force microscopy (AFM) image of the transferred h-BN domains on $SiO_2$/Si substrate. The white arrows indicate the convexly curved edges and the inset shows the thickness of the film across the blue line.

FIG. 3C shows an optically enhanced image of the transferred h-BN domains on the $SiO_2$/Si substrate for easy identification. Intriguingly, notable difference to the domain shape was observed on the h-BN obtained herein as compared to most h-BN domains grown by using AB as precursor where they composed of regular shaped triangles with straight edges. Instead, triangles with convexly curved edges or Reuleaux triangles were constantly observed for the h-BN domains grown using TMAB, which were further indicated by the white arrows in the AFM image of the transferred h-BN domains on $SiO_2$/Si substrate (FIG. 3D).

To explain the evolution of the curved edges of the h-BN domains, such isotropic growth mechanism may be attributed to the high concentration of adatoms along the circumference of the h-BN nuclei which may be controllably obtained by increasing the $T_s$ of AB. Since TMAB had a lower melting temperature than AB, the sublimation may occur at a faster rate when a smaller increase in $T_s$ was applied. This was evident in the TGA profile of TMAB where the gradient of weight loss increased with increasing temperature (FIG. 1C).

In addition, as the growth was carried out using AP, this may further facilitate the supply of precursor to the growth substrate and hence, resulted in enhanced attachment kinetics. The inset of FIG. 3D shows the typical thickness of the h-BN was about 0.55 nm, corresponding to a monolayer (interlayer spacing for h-BN was about 0.33 nm).

Figure 3E:
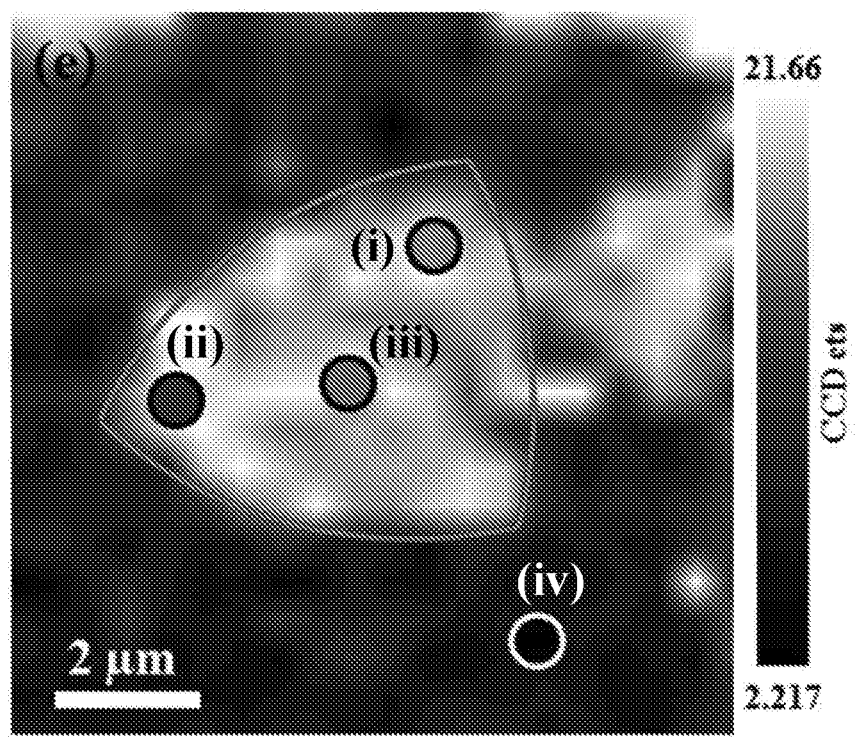
FIG. 3E shows Raman mapping of an individual h-BN domain.
Figure 3F:
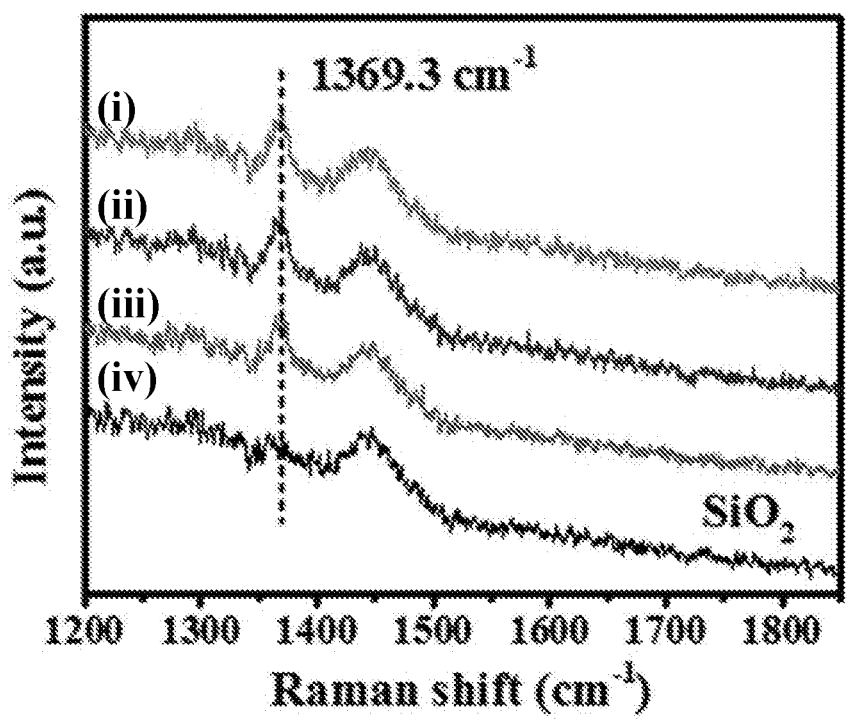
FIG. 3F shows corresponding Raman spectra as indicated by the (i) magenta, (ii) blue, (iii) red, and (iv) black spots in FIG. 3E.

FIG. 3E shows the Raman peak intensity map of an individual h-BN domain between 1360 and 1380 $cm^{-1}$. As the intensity of the $E_{2g}$ peak was very weak for monolayer h-BN, a slight non-uniformity to the color distribution within the domain was observed, attributing to the noise contributions when the integration time was set at 10 s for each scanned pixel. FIG. 3F shows the corresponding Raman spectra taken at three random locations in the h-BN domain using a longer integration time of 30 s and accumulated twice, in comparison with the $SiO_2$ surface. It was observed that the Raman spectra of the h-BN domain are consistent with a peak located at 1369.3 $cm^{-1}$, corresponding to the $E_{2g}$ vibration mode of monolayer h-BN. The other peak at about 1450 $cm^{-1}$ was assigned to the third order transverse optical (TO) phonon mode of Si which was also present on the $SiO_2$ surface.

Figure 3G:
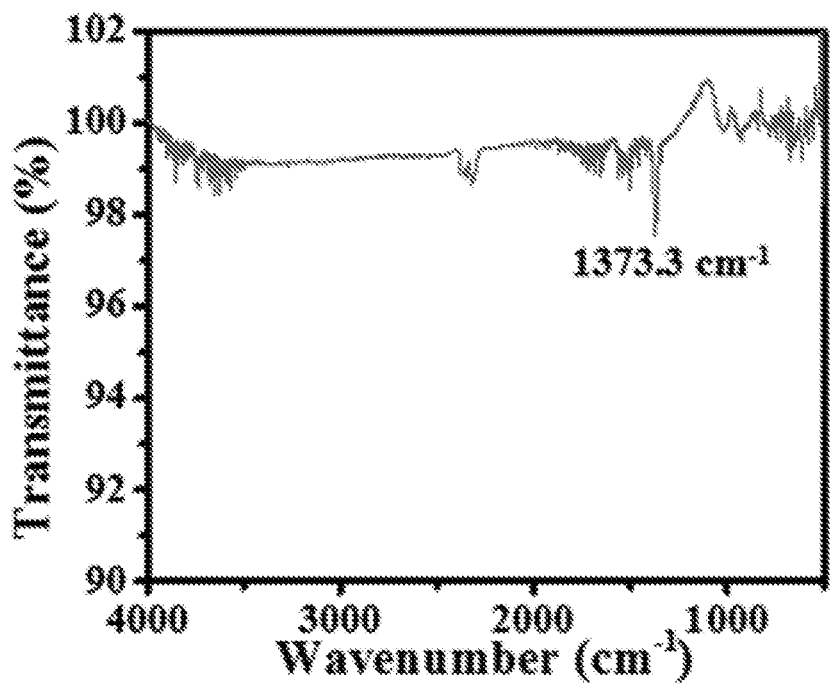
FIG. 3G is a graph showing Fourier Transform Infrared spectroscopy (FTIR) spectrum of a monolayer h-BN.

FIG. 3G shows a typical FT-IR spectrum for the monolayer h-BN with a distinctive peak at 1373.3 $cm^{-1}$ corresponding to in-plane B—N stretching mode. No peak at about 780 $cm^{-1}$ corresponding to out-of-plane B—N—B bending mode was observed as this peak was reported to be three times weaker for h-BN films. Furthermore, due to the low dimensionality of the monolayer film, this peak became undetectable due to the lack of out-of-plane motion. UV-vis spectroscopy was used to determine the OBG of the h-BN film and detect doping effect in the system.

Figure 3H:
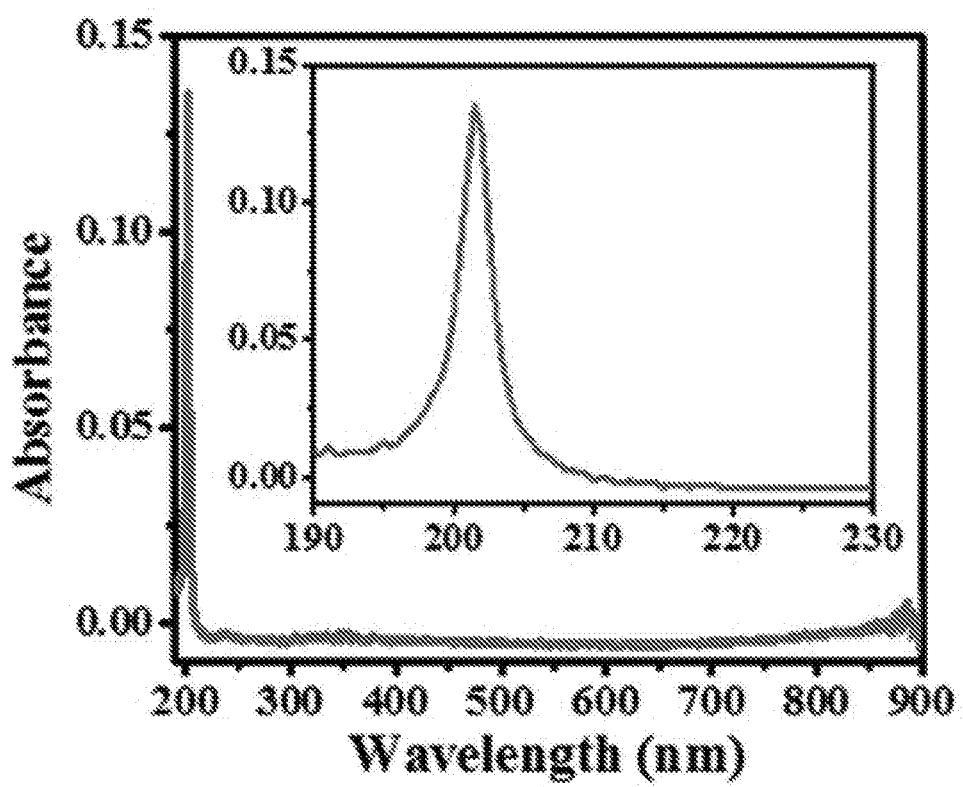
FIG. 3H is a graph showing absorbance spectrum.
Figure 3I:
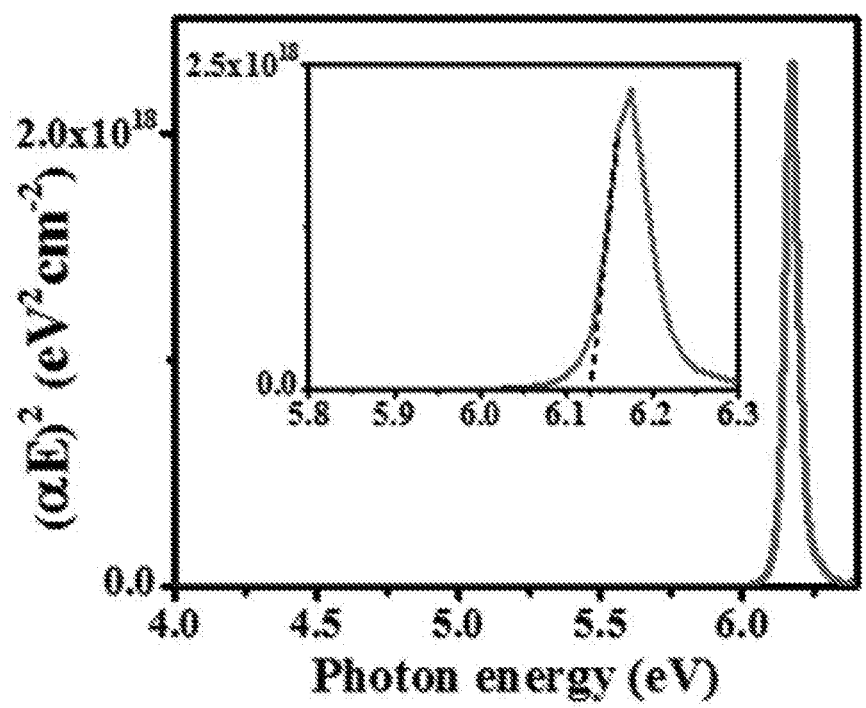
FIG. 3I is a graph showing corresponding Tauc's plot for OBG extraction of the monolayer h-BN of FIG. 3H.

FIG. 3H shows the absorbance spectrum of the monolayer h-BN film transferred onto a quartz substrate. It was observed that the h-BN film had a single sharp peak at 201.5 nm, which was a typical signature for a pristine atomically thin h-BN film. To extract the OBG of the film, the absorbance spectrum was converted into Tauc's plot using a derived formula for direct band gap semiconductor, $$\alpha = C(E-E_g)^{1/2}/E \qquad (1)$$

where $\alpha$ is the absorption coefficient, C is a constant and E is the photon energy. Note that $\alpha$ was obtained from the optical absorption divided by the thickness of the film. Hence, by plotting $(\alpha E)^2$ against E, a straight line may be extrapolated on the energy dispersion curve and $E_g$ can be extracted from the intersection of the extrapolated line and the x-axis. FIG. 3I shows the Tauc's plot of the h-BN monolayer. The extracted OBG was 6.13 eV, comparable to the theoretical value of 6.0 eV.

Figure 4A:
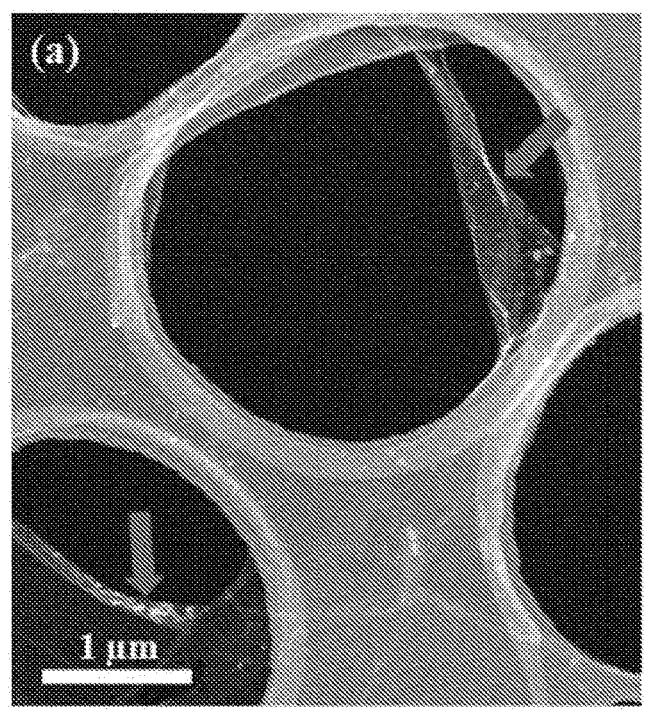
FIG. 4A is a typical low-magnification transmission electron microscopy (TEM) image of a transferred monolayer h-BN film on a TEM grid.
Figure 4B:
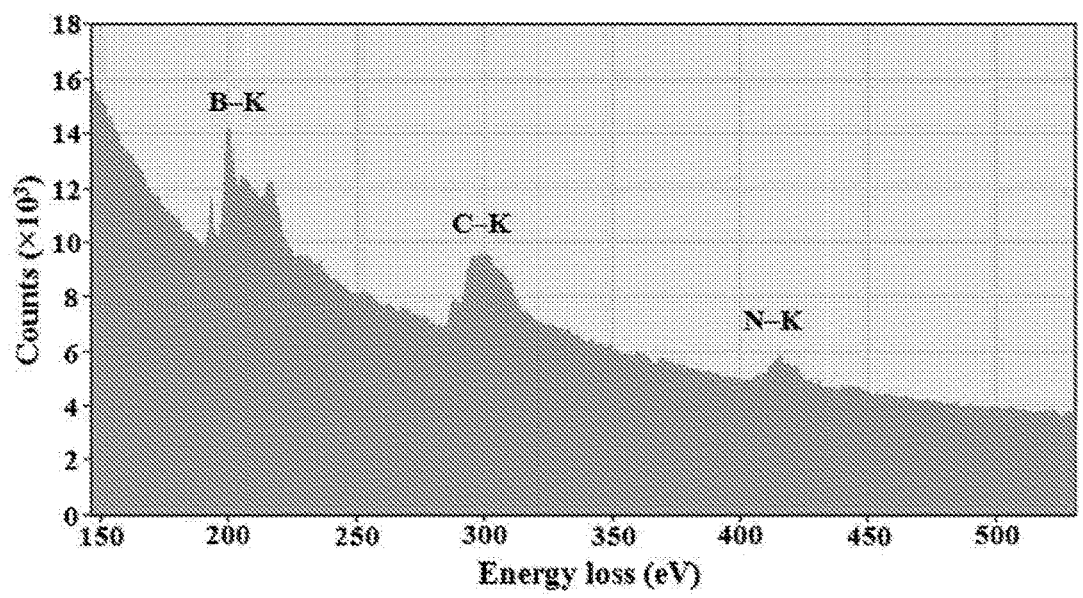
FIG. 4B shows electron energy loss spectroscopy (EELS) spectrum of the h-BN film depicted in FIG. 4A.

TEM technique was employed to further identify the atomic structure and monolayer nature of the as-prepared h-BN films. FIG. 4A shows a typical low-magnification TEM image of the transferred monolayer h-BN film on a TEM grid. Several folded regions, as indicated by the red arrows, can be observed at some regions of the film due to the transfer process. FIG. 4B shows the electron energy-loss spectroscopy (EELS) spectrum of the h-BN film. Two absorption peaks commencing at 188 and 401 eV are observed, corresponding to the K-shell ionization edges of B and N, respectively, which are characteristic peaks for $sp^2$ hydridized B—N bonds. Another absorption peak commencing at 284 eV is assigned to C—C bonds due to contamination of the polymethyl methacrylate (PMMA) residues which might have not been totally removed after the transfer process. The extracted N/B ratio is 1.03, which is very close to the ideal value of 1 for h-BN.

Figure 4C:
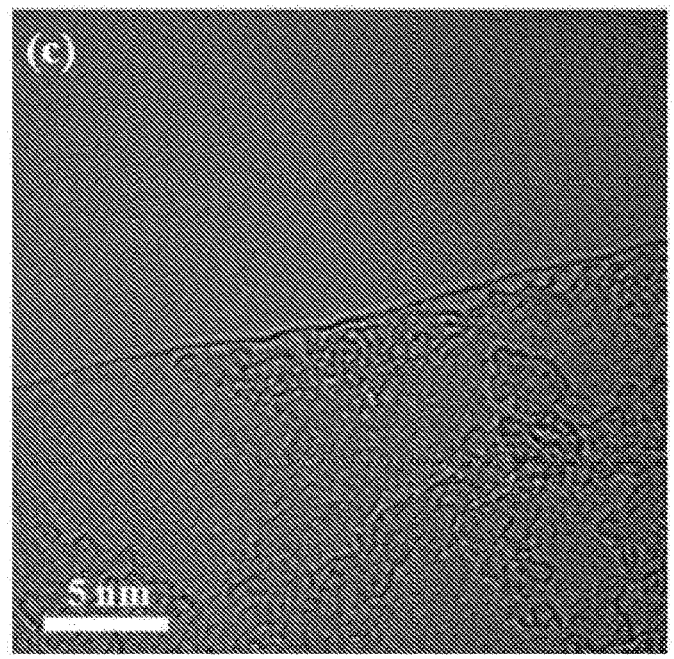
FIG. 4C is a high-magnification TEM image taken at the edge of the transferred monolayer h-BN film.
Figure 4D:
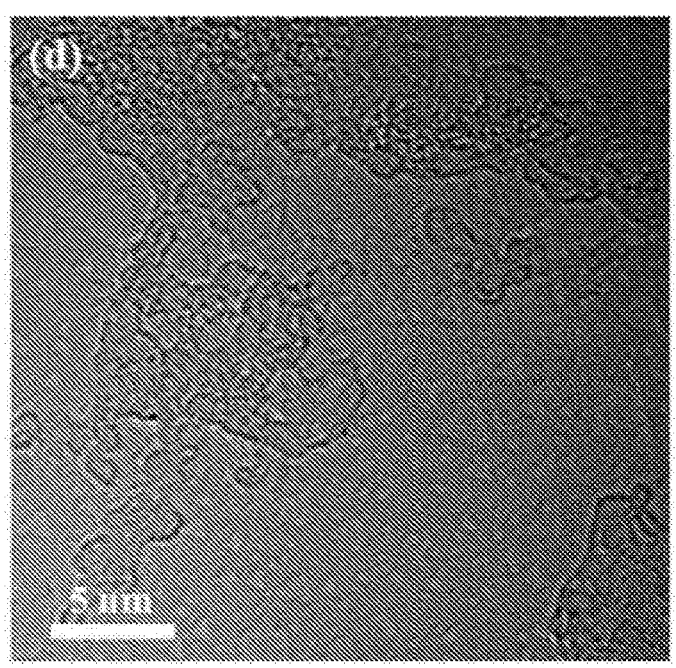
FIG. 4D is a high-magnification TEM image taken at the interior of the transferred monolayer h-BN film. The dashed outlines in indicate triangular holes in the film.

FIG. 4C and FIG. 4D are high-magnification TEM images at the edge and interior of the transferred h-BN film, respectively. A single layer at the edge of the h-BN film was clearly identified in FIG. 4C. In addition, many nano-sized triangle holes (outlined in dashed lines in FIG. 4D), which were generated due to electron knock-on damage may be observed on the film, further demonstrating the monolayer nature of the h-BN film.

Figure 4E:
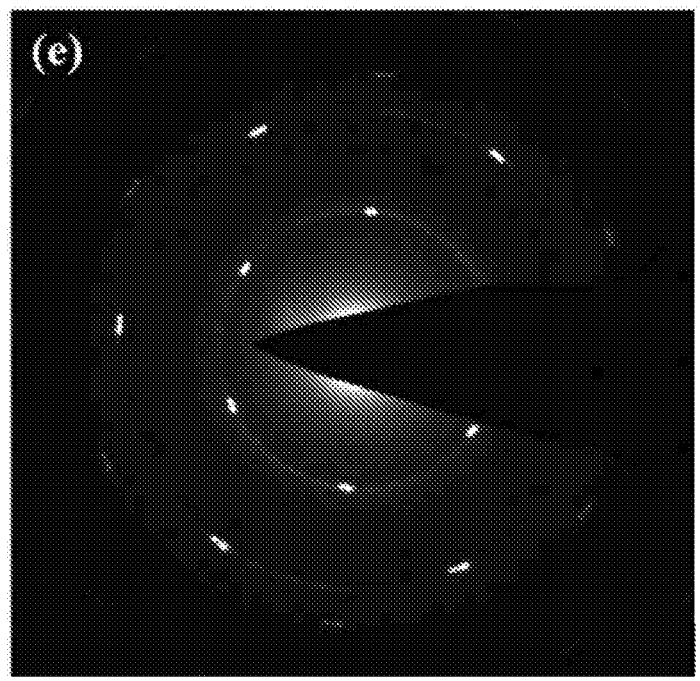
FIG. 4E is a typical selected area electron diffraction (SAED) pattern of the monolayer h-BN.

To evaluate the crystallinity in the film, selected area electron diffraction (SAED) was carried out on the transferred h-BN film (FIG. 4E). The SAED revealed 6 distinctive spots arranged in a hexagonal pattern, corresponding to the hexagonal structure as expected for h-BN films.

The elemental composition and chemical structure of the as-prepared film were further investigated using XPS. To determine C content in the film, the inventors did a systematic comparison between the XPS spectra of the h-BN/Cu and an annealed Cu which underwent the same growth condition but without exposure to TMAB.

Figure 5A:
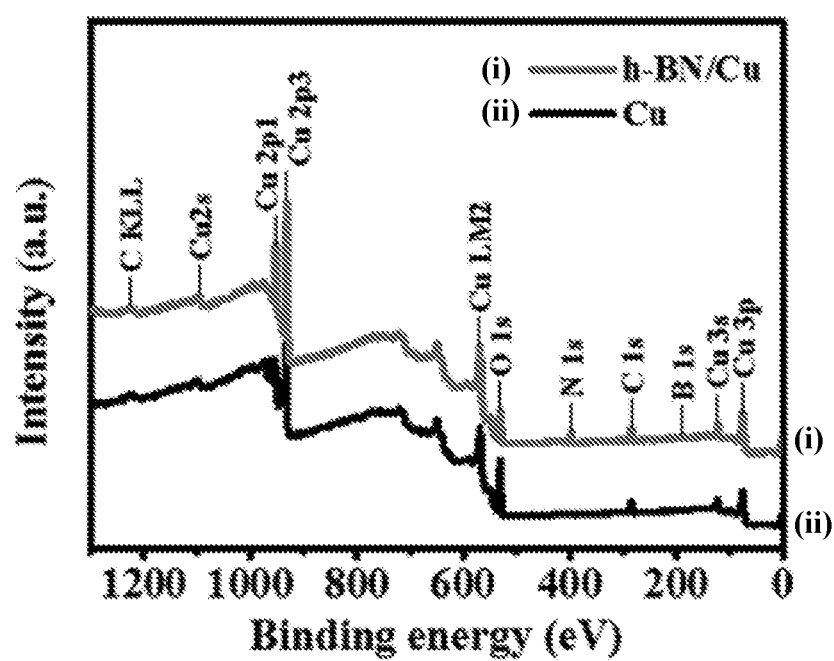
FIG. 5A is a graph showing X-ray photoelectron spectroscopy (XPS) survey spectra of an as-grown h-BN/Cu ((i), red trace) and an annealed bare Cu ((ii), black trace).
Figure 5B:
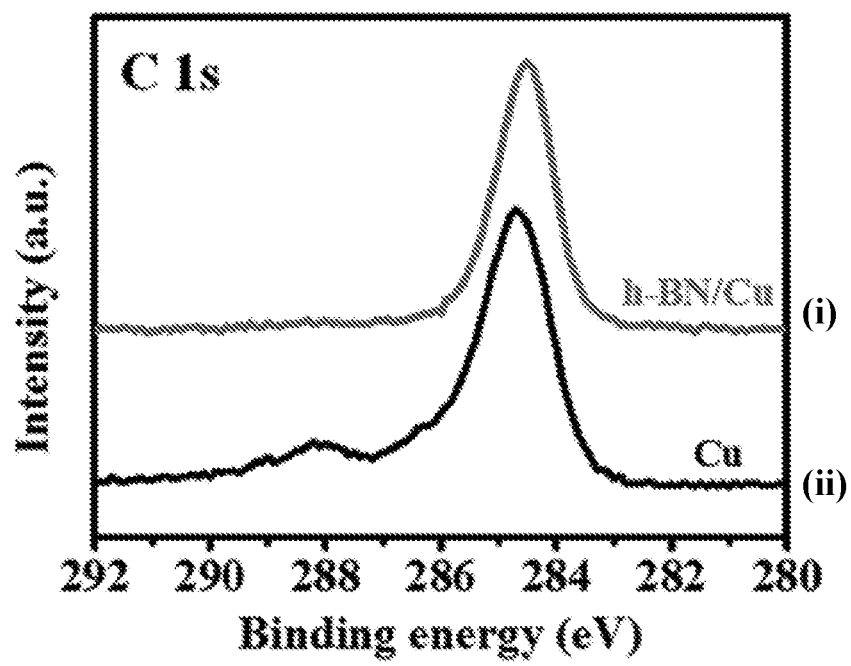
FIG. 5B is a graph showing C is spectra of the as-grown h-BN/Cu ((i), red trace) and annealed bare Cu ((ii), black trace).
Figure 5C:
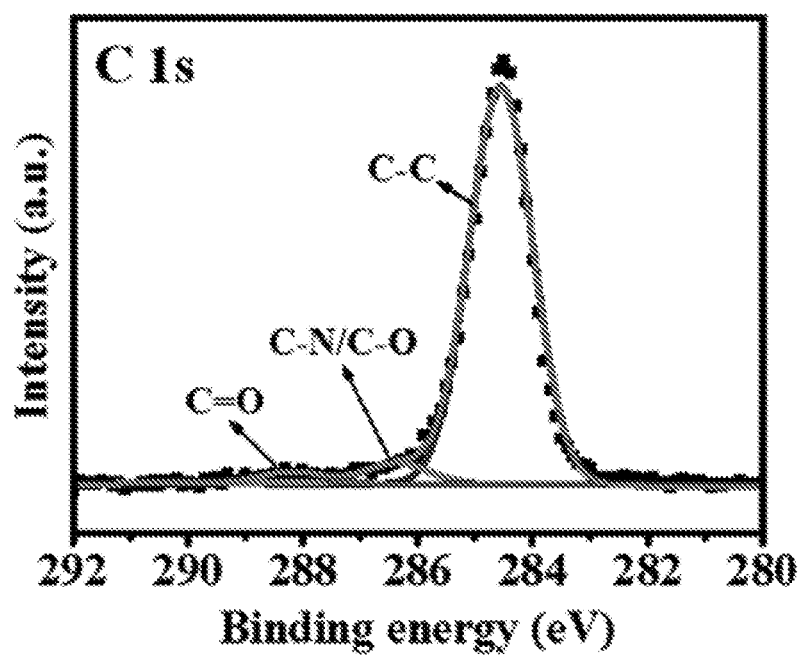
FIG. 5C is a graph showing deconvoluted high-resolution C is XPS spectra of the h-BN/Cu.

FIG. 5A shows the XPS survey spectra of the h-BN/Cu and bare annealed Cu samples. It was observed that both samples contained Cu, O and C elements while B and N elements only existed in the h-BN/Cu sample. In addition, O is peak with a relatively lower intensity was observed for the h-BN/Cu sample, attributing to the h-BN film which acted as a protective layer against oxidation for the underlying Cu substrate. C is peak was detected in both samples due to the presence of C impurities in the Cu foils (FIG. 5B). The more prominent shoulder at 288.1 eV for the annealed Cu was due to C=O bond which originated from the higher amount surface Cu oxide. As shown in FIG. 5C, C is spectrum of h-BN/Cu may be deconvoluted into three peaks located at 284.5 eV, 286.4 eV, and 288.2 eV, which were assigned to C—C, C—N/C—O and C=O bonds, respectively. However, these peaks were not representative of the film structure as they may also be extracted from the bare annealed Cu foil. Therefore, the inventors focused their study on B is and N is spectra to further identify the bonding structure of the B and N atoms in the film. The N/B ratio extracted based on the integral intensities of each element peak was 1.11, which was consistent with the abovementioned value as identified by EELS.

Figure 5D:
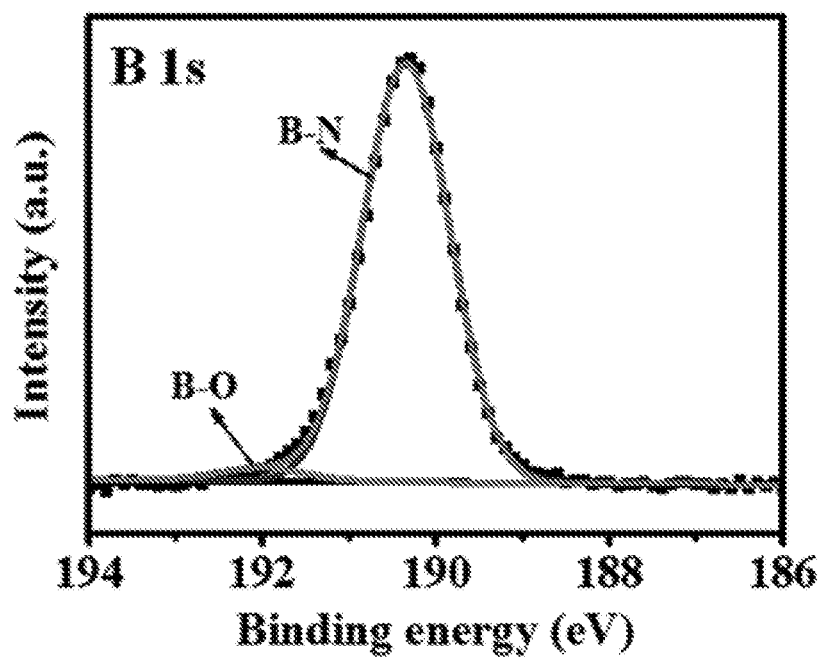
FIG. 5D is a graph showing deconvoluted high-resolution B is XPS spectra of the h-BN/Cu.
Figure 5E:
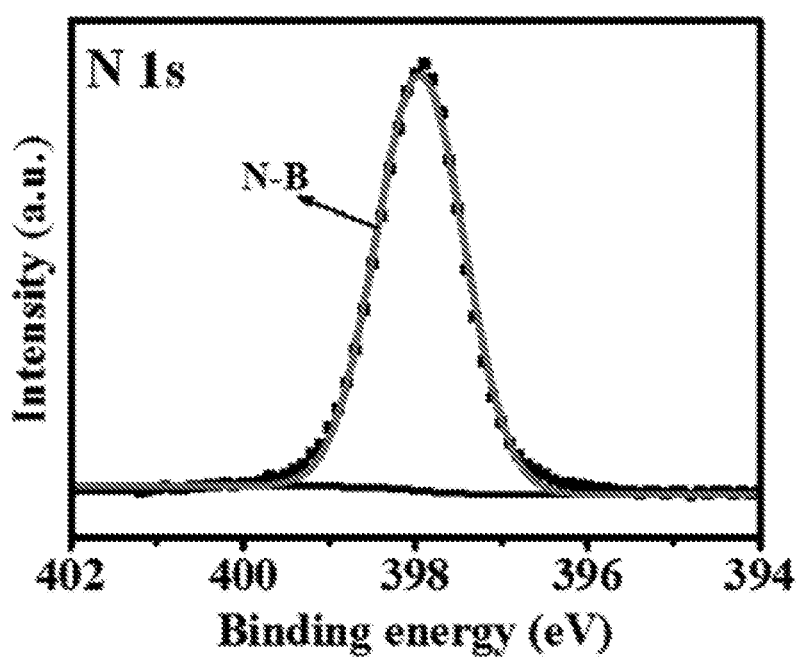
FIG. 5E is a graph showing deconvoluted high-resolution N is XPS spectra of the h-BN/Cu.
Figure 5F:
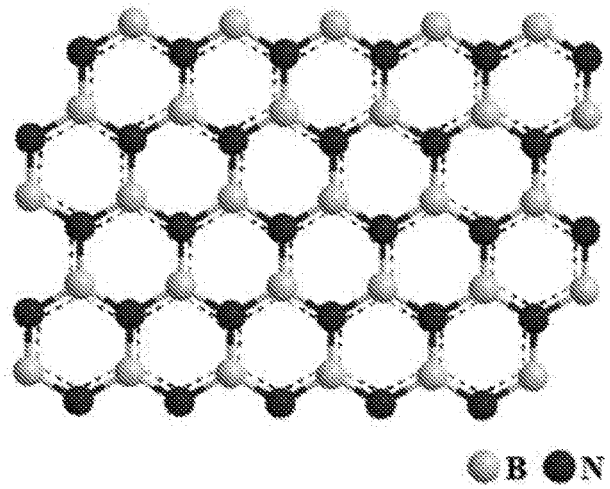
FIG. 5F is a schematic diagram showing chemical bonding structure of the h-BN film.

FIG. 5D and FIG. 5E show high resolution XPS spectra of B is and N is as well as their corresponding fitted peak profiles. The deconvoluted B is spectrum distinguished two peaks located at 190.3 eV and 192.1 eV. The main component centered at 190.3 eV corresponded to B—N bonding and the smaller shoulder at higher binding energy was assigned to B—O bonding. The presence of B—O bonding may be attributed to surface impurities or the defective sites in the h-BN film. The fitted N is peak in FIG. 5E revealed only one component at 398.0 eV accounting for N—B bonding. Based on all the above-mentioned characterization and analysis, the inventors may reasonably conclude that the as-obtained domains/partial films corresponded well to h-BN monolayers with negligible amount of C impurities (FIG. 5F).

Figure 6A:
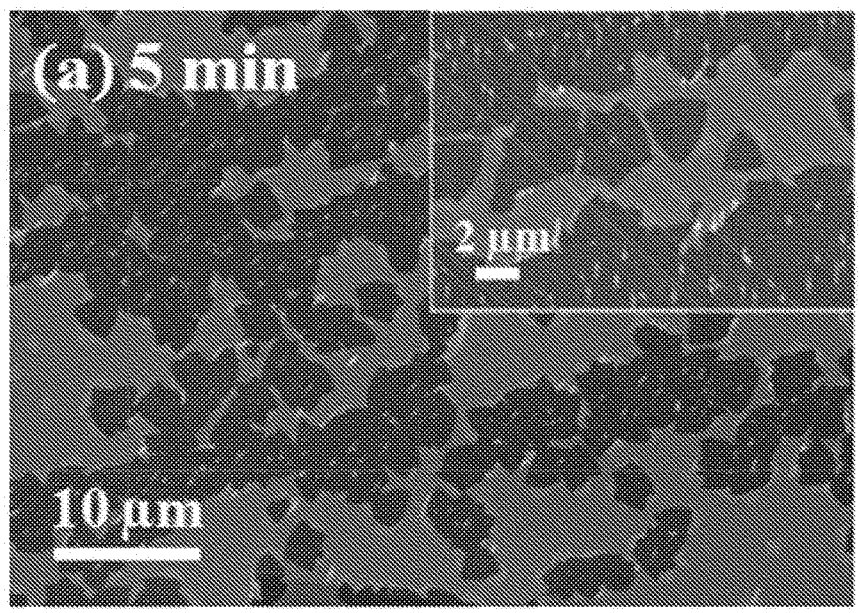
FIG. 6A is an SEM image of an as-grown h-BN on Cu after 5 minutes of exposure to TMAB at a $T_s$ of 40° C. The insets show their corresponding magnified SEM images.
Figure 6B:
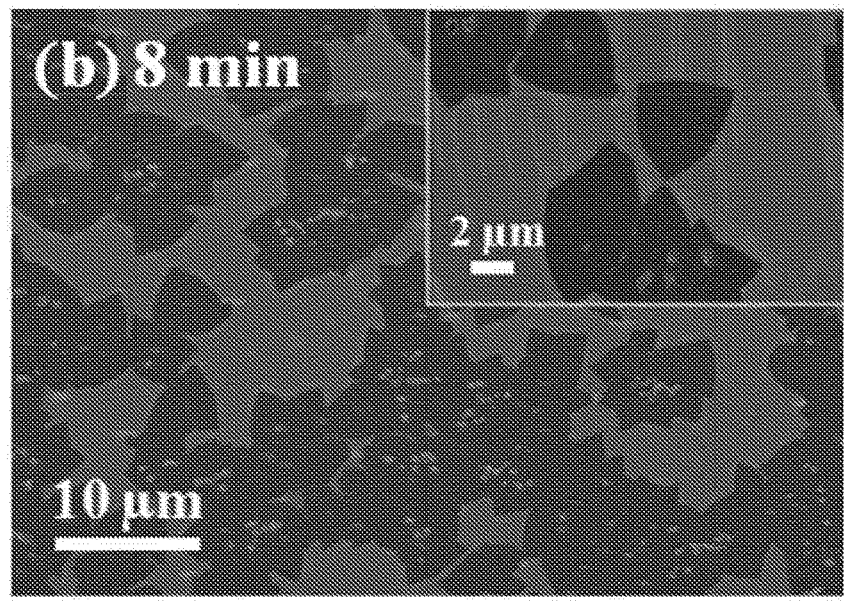
FIG. 6B is an SEM image of an as-grown h-BN on Cu after 8 minutes of exposure to TMAB at a $T_s$ of 40° C. The insets show their corresponding magnified SEM images.
Figure 6C:
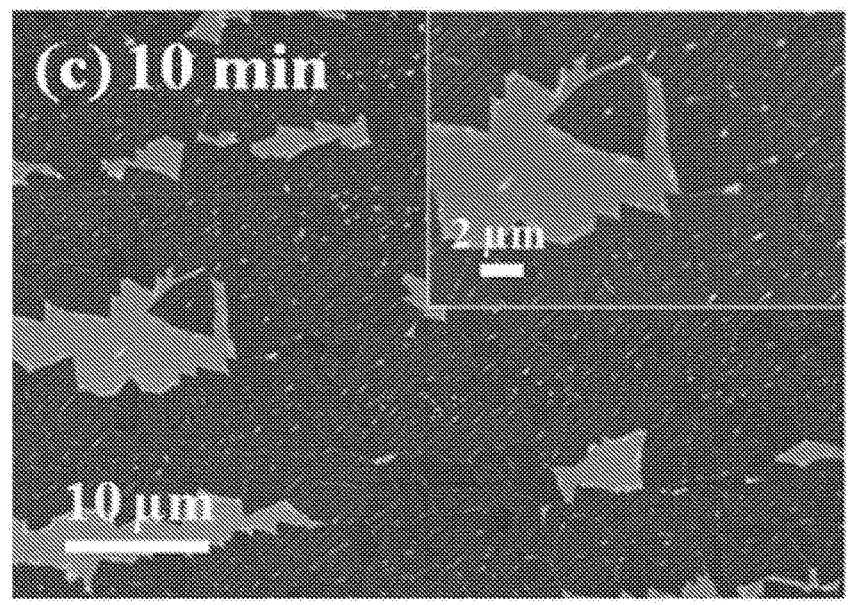
FIG. 6C is an SEM image of an as-grown h-BN on Cu after 10 minutes of exposure to TMAB at a $T_s$ of 40° C. The insets show their corresponding magnified SEM images.
Figure 6D:
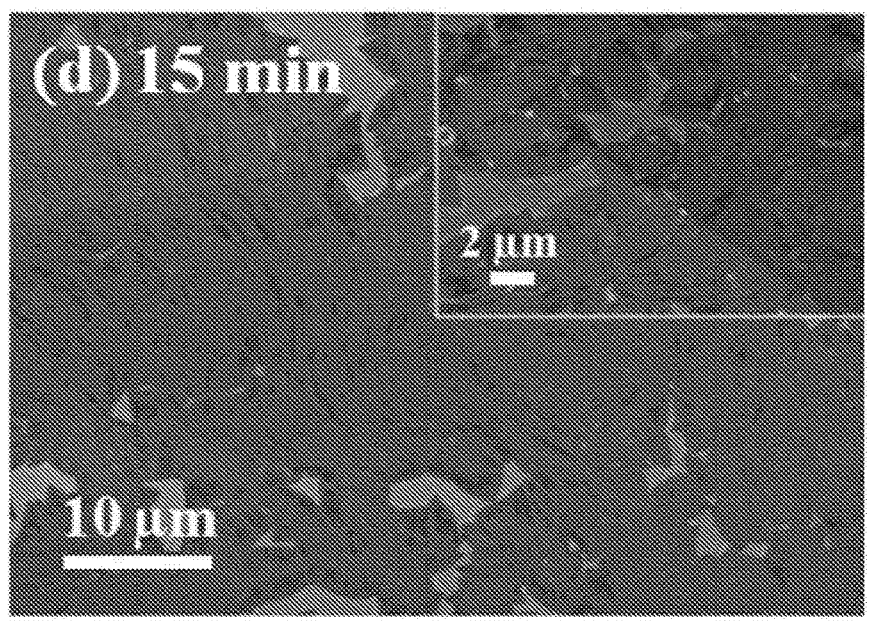
FIG. 6D is an SEM image of an as-grown h-BN on Cu after 15 minutes of exposure to TMAB at a $T_s$ of 40° C. The insets show their corresponding magnified SEM images.
Figure 6E:
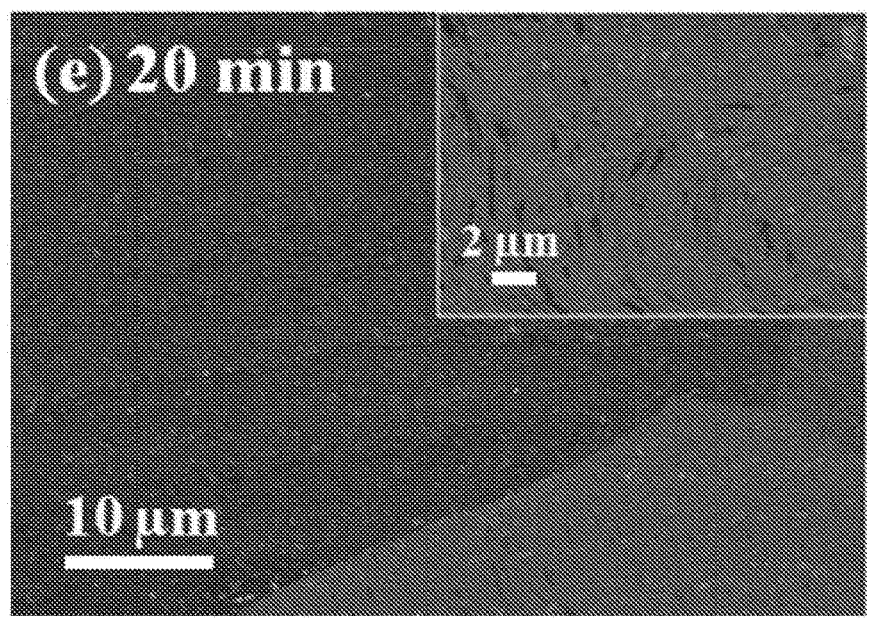
FIG. 6E is an SEM image of an as-grown h-BN on Cu after 20 minutes of exposure to TMAB at a $T_s$ of 40° C. The insets show their corresponding magnified SEM images.
Figure 6F:
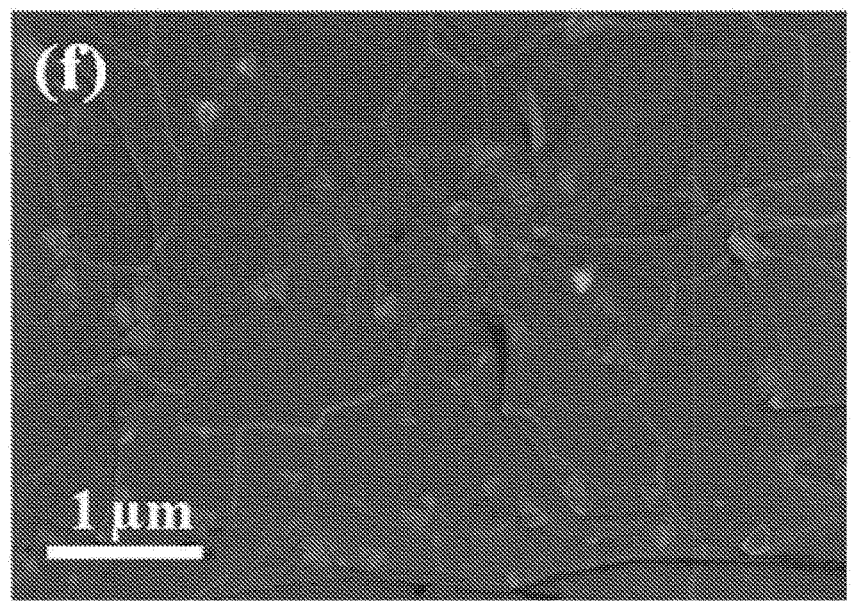
FIG. 6F is a high-magnification SEM image of the film in FIG. 6E to reveal the adlayer triangular shaped islands.

To verify the growth mechanism for the h-BN films, a time-dependent study was conducted to observe the evolution from sporadic domains into a continuous film. FIG. 6A to FIG. 6E show the SEM images of the as-grown h-BN films after various growth durations ranging from 5 to 20 min. After 5 min of growth, the domain size was typically about 2 μm in length with many nucleation along the uneven Cu surface (FIG. 6A). By prolonging the growth time to 8 and 10 min (FIG. 6B and FIG. 6C), average size of the domains increased to about 5 am with obvious increase in nucleation sites forming patches of discontinuous films by coalescing with neighboring domains. Single-crystal domain was hardly observed when the growth time was further increased to 15 min and 20 min (FIG. 6D and FIG. 6E) and a continuous film covering the entire surface of the Cu substrate over centimeter distances was obtained after 20 min of growth. The growth was not self-limited and did not cease after a monolayer was formed. Presence of nano-sized triangular shaped adlayer islands (outlined in red) may be observed within the existing monolayer (FIG. 6F). Hence, growth of the h-BN using TMAB may be similar to that of using AB as the precursor.

Figure 7A:
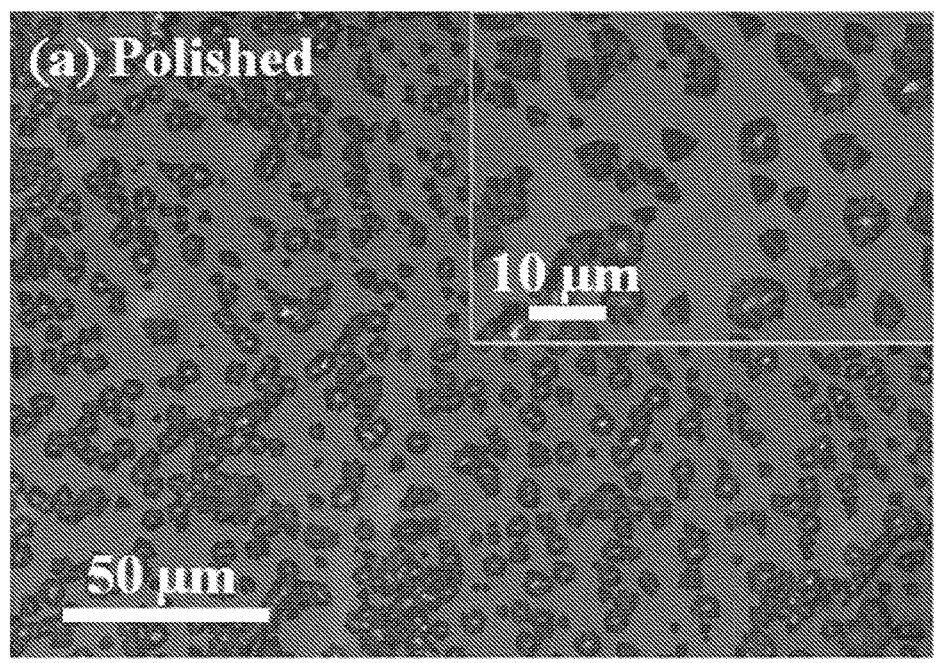
FIG. 7A is a SEM image of as-grown h-BN domains on polished Cu. The inset is its magnified SEM image.
Figure 7B:
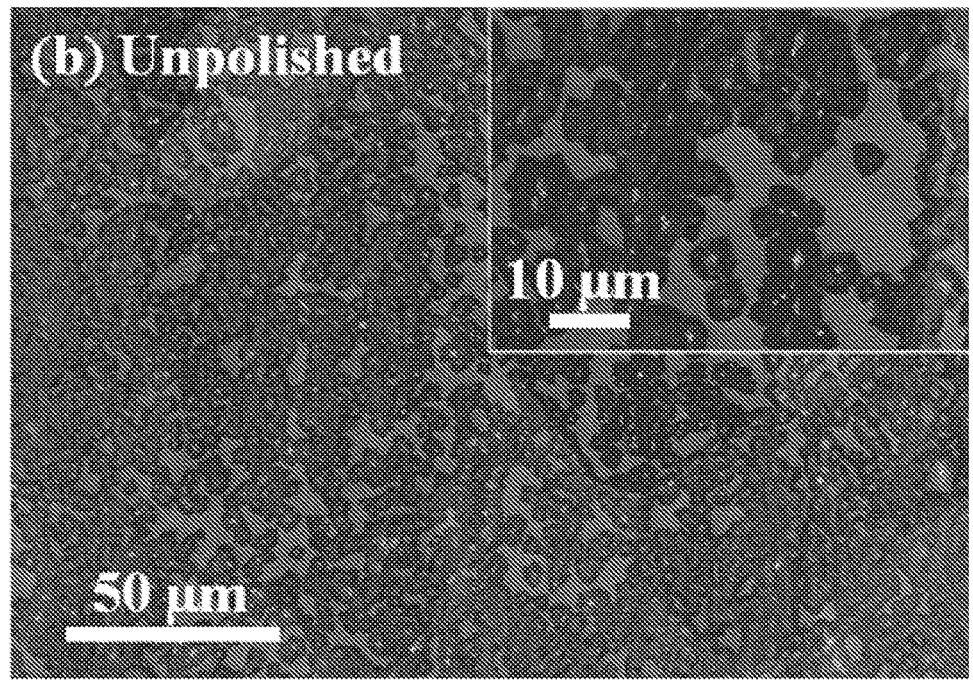
FIG. 7B is a SEM image of as-grown h-BN domains on unpolished Cu. The inset is its magnified SEM image.
Figure 8:
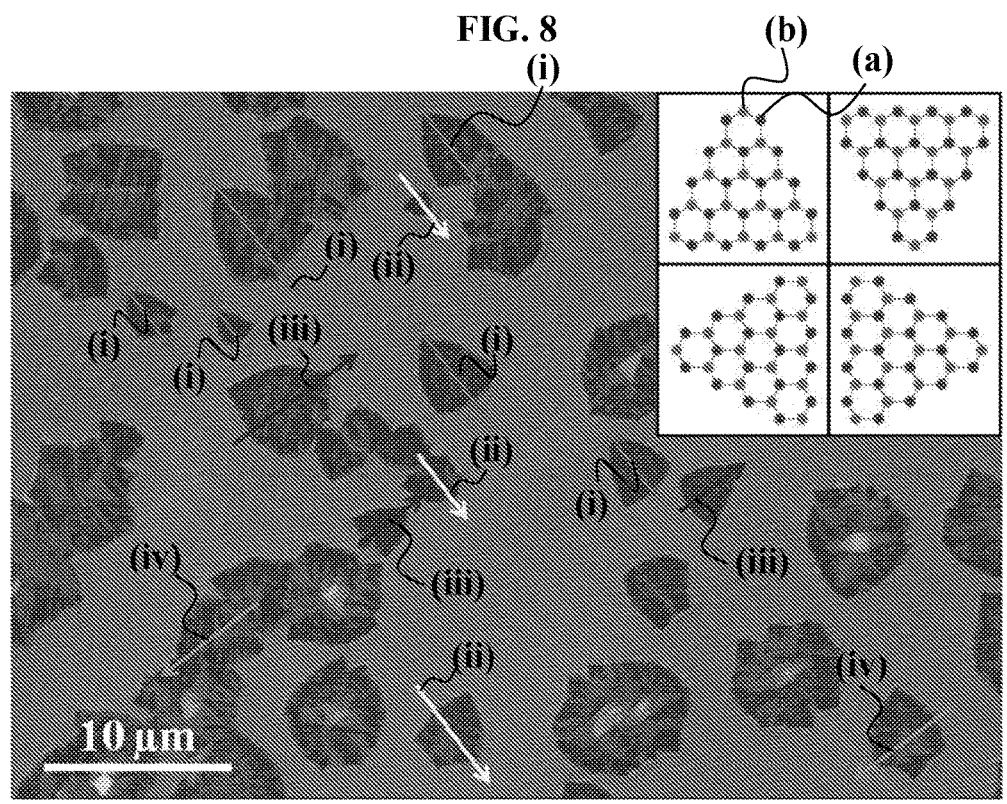
FIG. 8 is a SEM image of h-BN single-crystal domains on polished Cu. The red, yellow, blue and green arrows represent the relative orientations of the domains. The four orientations may be briefly described by simple geometric representations as shown in the inset. The (a) blue and (b) red spheres represent N and B atoms, respectively. In the SEM image, the ((i) red and (ii) yellow) and ((iii) blue and (iv) green) arrows corresponded to 180° mirroring domains (equivalent to 60° rotation in a h-BN unit cell), suggesting that the h-BN domains followed a strict epitaxial relationship with the Cu lattice.
Figure 9A:
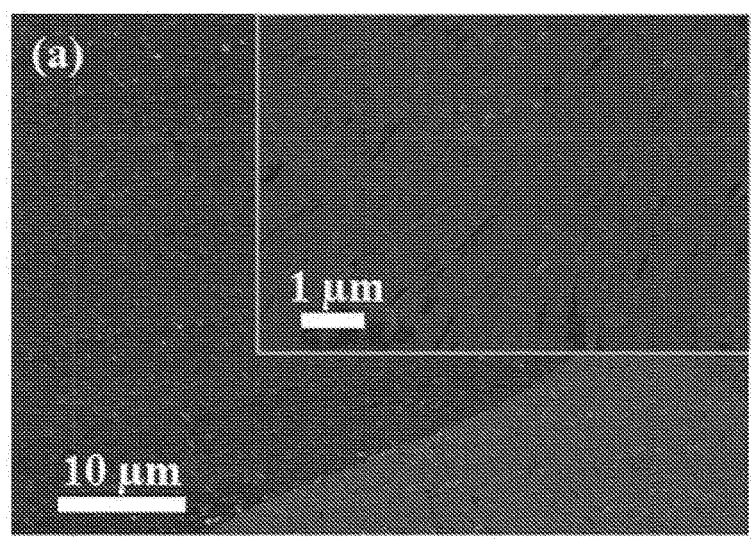
FIG. 9A is a SEM image of as-grown full coverage BN40 film on Cu.
Figure 9B:
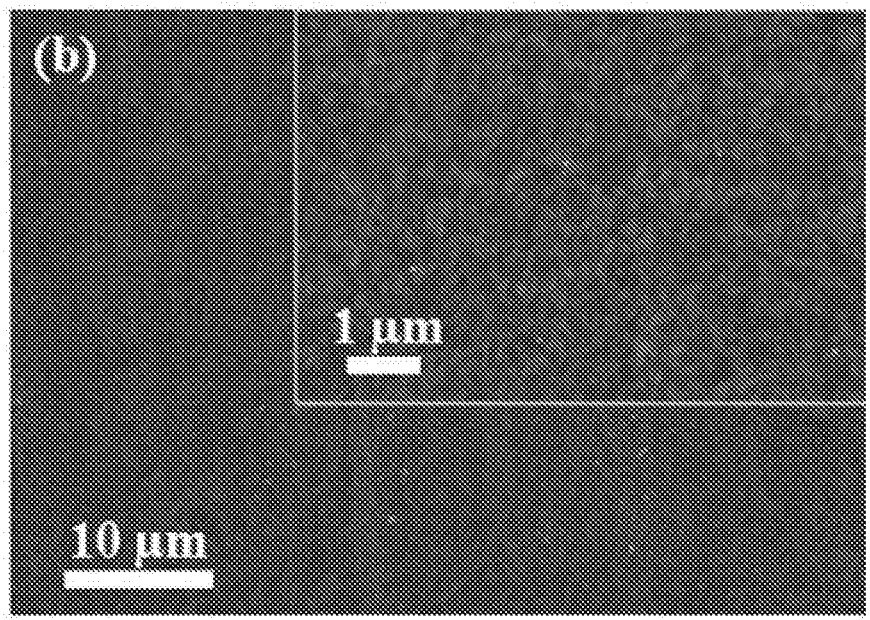
FIG. 9B is a SEM image of as-grown full coverage BCN50 film on Cu.
Figure 9C:
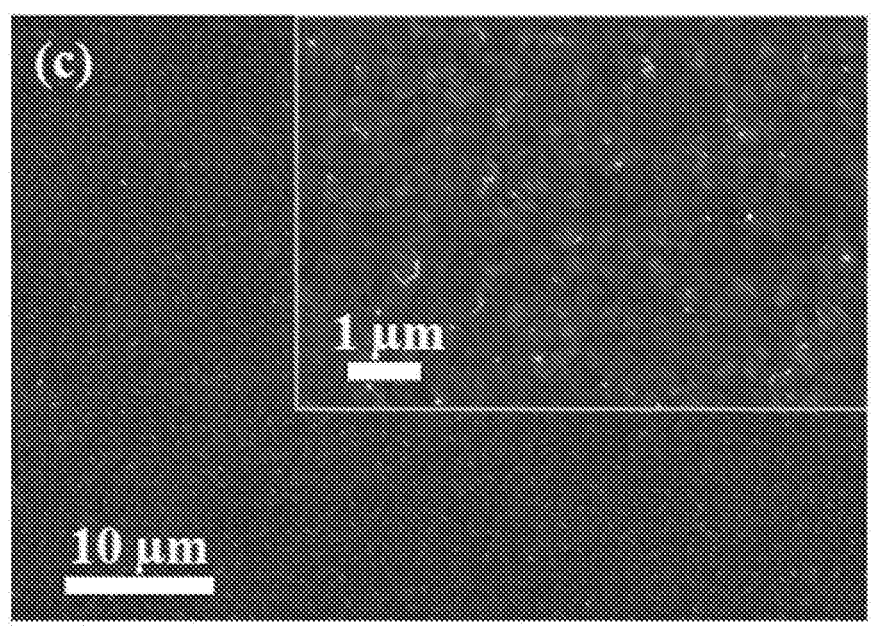
FIG. 9C is a SEM image of as-grown full coverage BCN60 film on Cu.
Figure 9D:
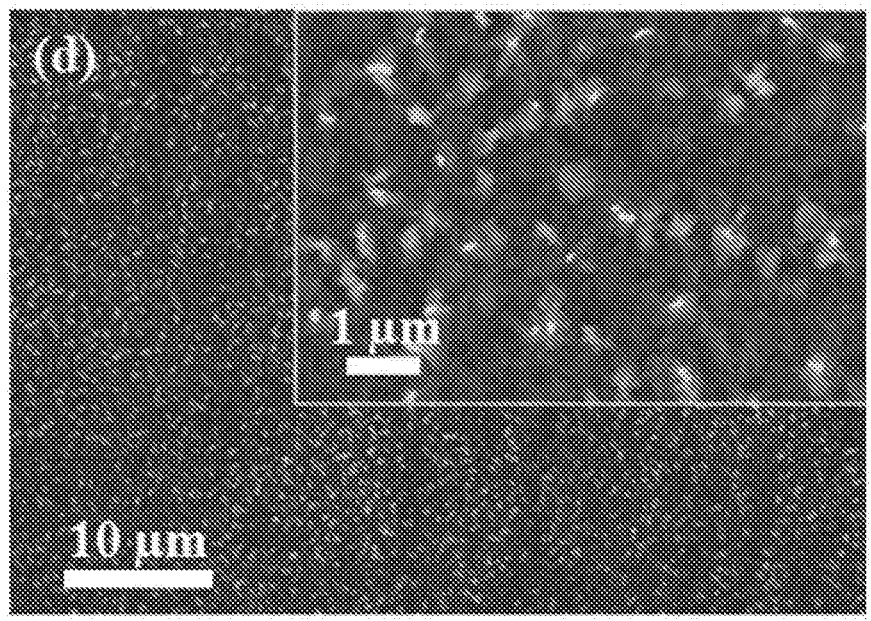
FIG. 9D is a SEM image of as-grown full coverage BCN70 film on Cu.
Figure 10A:
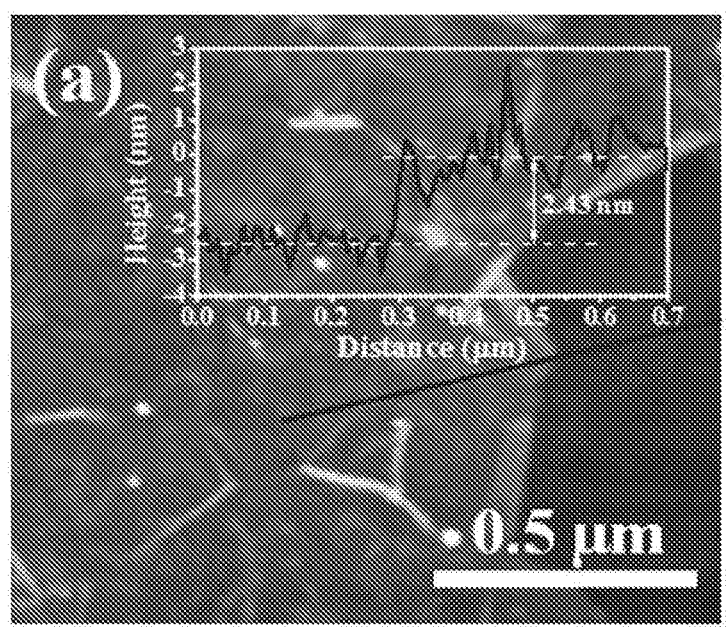
FIG. 10A is an AFM image of the transferred BN40 film on $SiO_2$/Si substrate with its height profile measured across the blue line as inset.
Figure 10B:
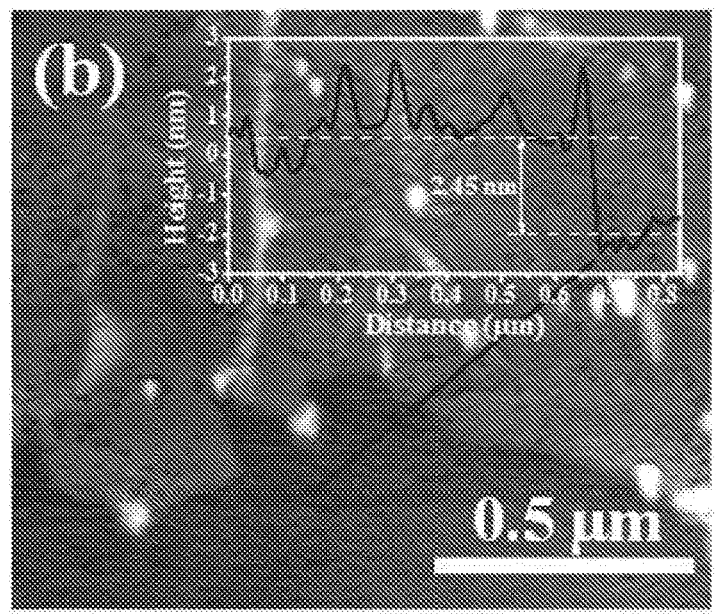
FIG. 10B is an AFM image of the transferred BCN50 film on $SiO_2$/Si substrate with its height profile measured across the blue line as inset.
Figure 10C:
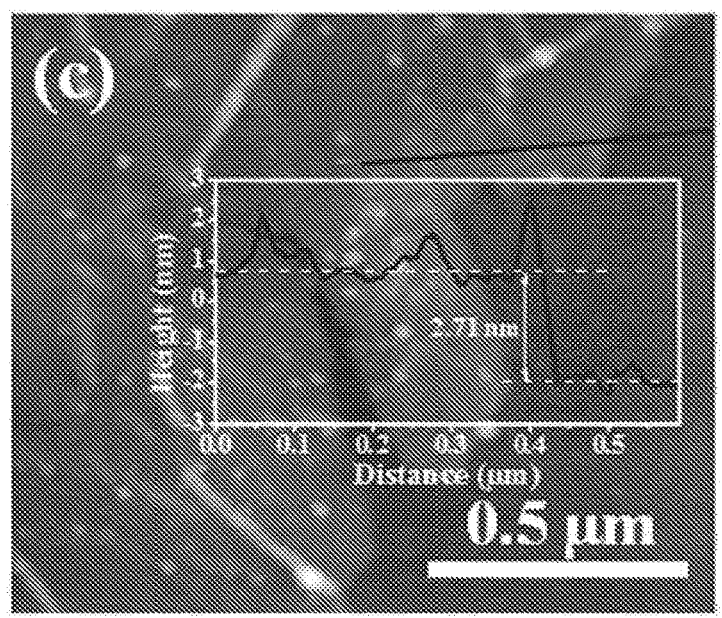
FIG. 10C is an AFM image of the transferred BCN60 film on $SiO_2$/Si substrate with its height profile measured across the blue line as inset.
Figure 10D:
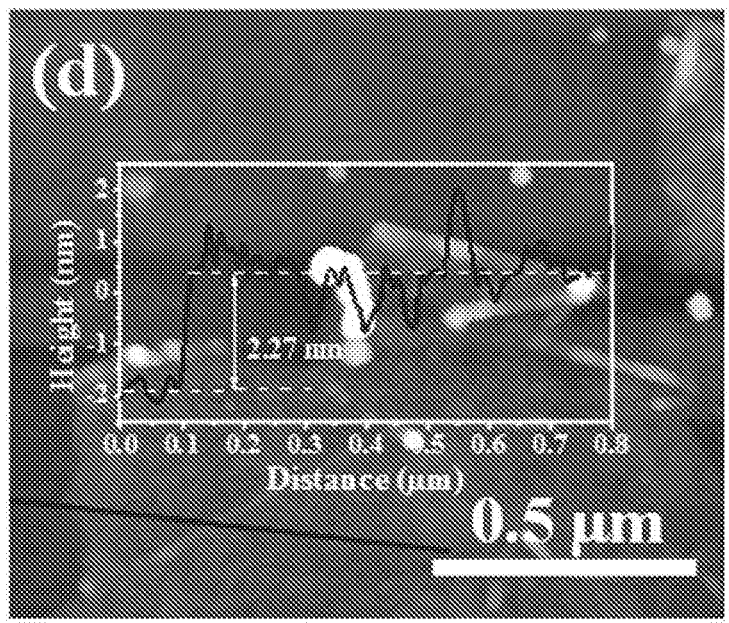
FIG. 10D is an AFM image of the transferred BCN70 film on $SiO_2$/Si substrate with its height profile measured across the blue line as inset.

As a smoother surface may increase the Gibbs free energy barrier, the nucleation of the h-BN domains may be further suppressed by using an electropolished Cu. FIG. 7A and FIG. 7B show the SEM images of the h-BN domains on a polished and unpolished Cu, respectively, which were grown simultaneously for 8 min. The epitaxial relationship between the isolated single-crystal domains and the Cu lattice may be identified by mapping out their relative orientations (FIG. 8).

Figure 7C:
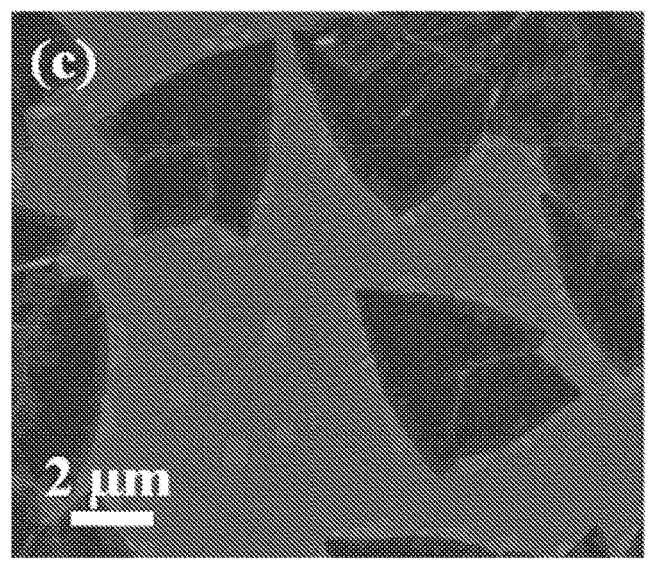
FIG. 7C is a SEM image depicting complex multifaceted structures of h-BN domains formed by coalescence between neighboring domains.
Figure 7D:
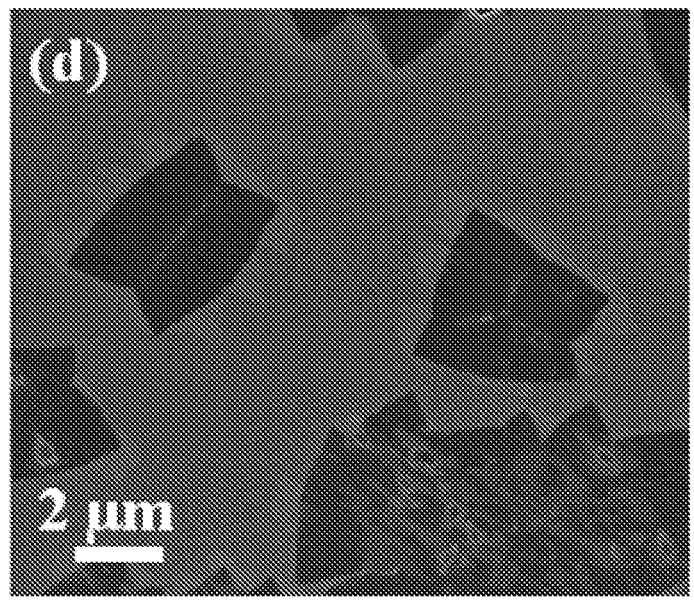
FIG. 7D is a SEM image depicting complex multifaceted structures of h-BN domains formed by coalescence between neighboring domains.
Figure 7E:
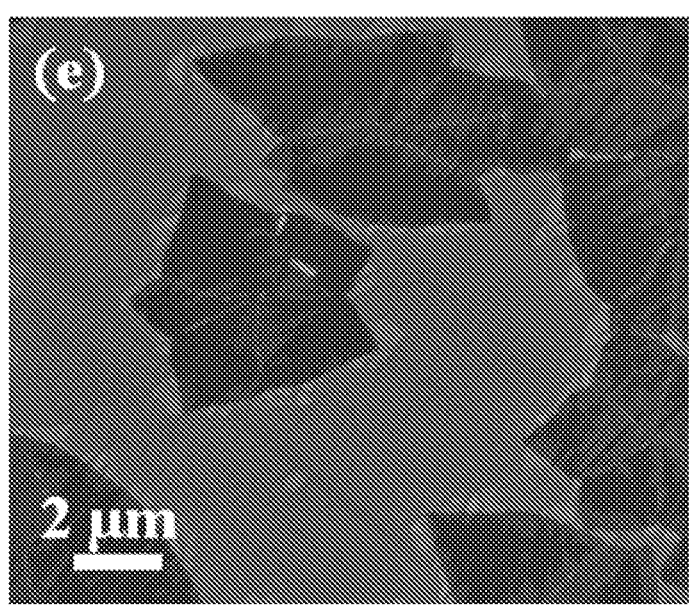
FIG. 7E is a SEM image depicting complex multifaceted structures of h-BN domains formed by coalescence between neighboring domains.

Various multifaceted complex structures consisting of multiple domains with grain boundaries or defect lines were observed due to the mirroring polarity of the domains (FIG. 7C to FIG. 7E). Such structures may be formed by either point-to-edge or edge-to-edge modes between two or more domains when they are nucleated close together.

Few-layer continuous films using higher $T_s$ were further grown and compared to the pristine h-BN film that was grown using a $T_s$ of 40° C. (FIG. 9A to FIG. 9D). The various films grown using $T_s$ of 40, 50, 60 and 70° C., were denoted as BN40, BCN50, BCN60 and BCN70, respectively, hereafter. AFM scans showed that the thicknesses of these BN and BCN films were similar which did not exceed 3 nm (FIG. 10A to FIG. 10D).

Figure 11A:
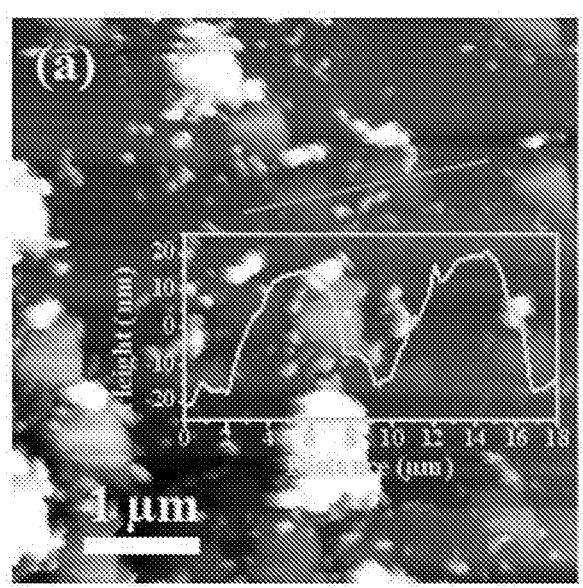
FIG. 11A is an AFM height image of a rough film grown at a $T_s$ of 80° C. Several submicron-sized triangular shaped multilayer islands reaching about 30 am in height may be observed in the film, suggesting the presence of h-BN multilayer.
Figure 11B:
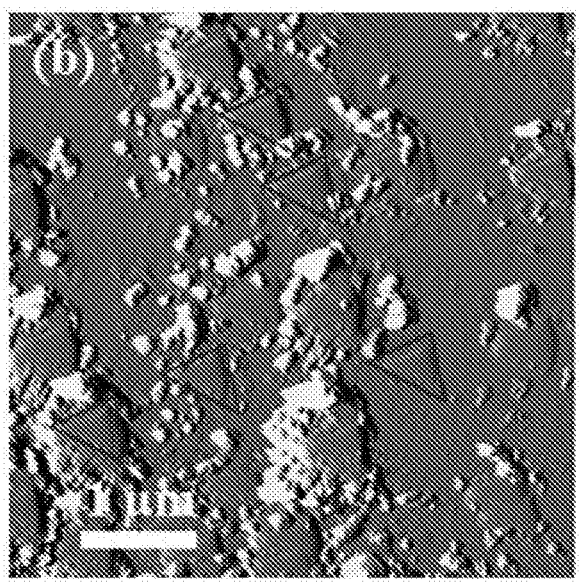
FIG. 11B is an AFM amplitude image of a rough film grown at a $T_s$ of 80° C. Several submicron-sized triangular shaped multilayer islands reaching about 30 μm in height may be observed in the film, suggesting the presence of h-BN multilayer.
Figure 11C:
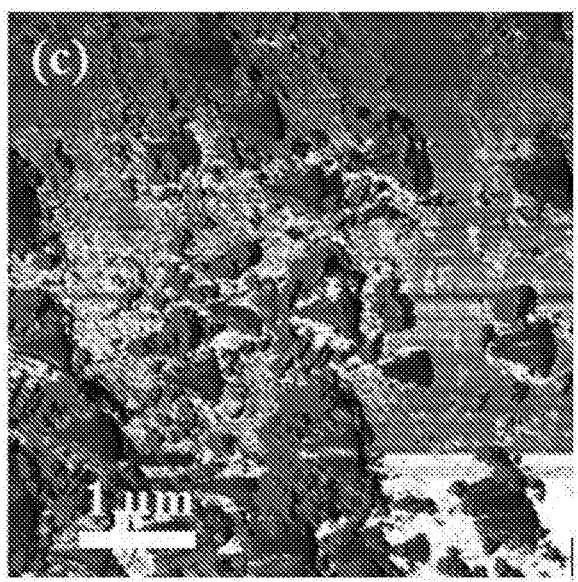
FIG. 11C is an AFM phase image of a rough film grown at a $T_s$ of 80° C. Several submicron-sized triangular shaped multilayer islands reaching about 30 μm in height may be observed in the film, suggesting the presence of h-BN multilayer.

When the $T_s$ is further increased to 80° C. and beyond, TMAB sublimated very quickly and the resultant film surface became very rough with many particles, and multilayer triangular shaped islands may be observed (FIG. 11A to FIG. 11C). To synthesize atomically thin films, $T_s$ of TMAB was limited to a maximum of 70° C.

Figure 12A:
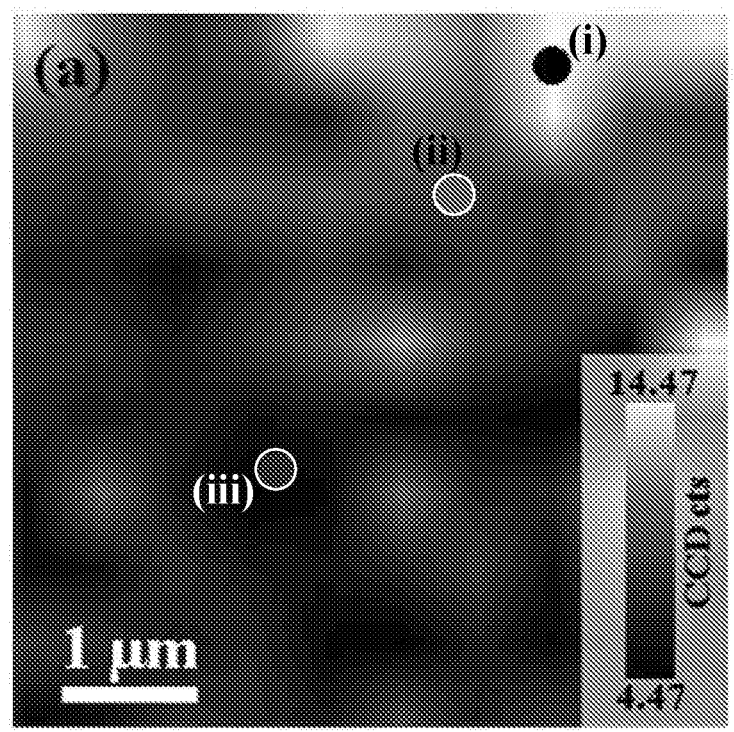
FIG. 12A is a G peak intensity Raman mapping for BCN50 film transferred on a $SiO_2$/Si substrate.
Figure 12B:
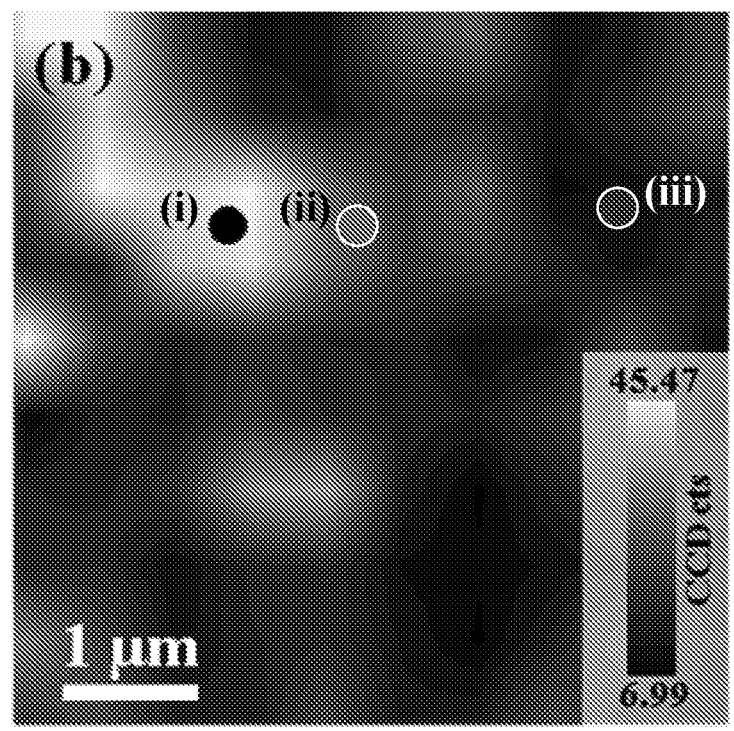
FIG. 12B is a G peak intensity Raman mapping for BCN60 film transferred on a $SiO_2$/Si substrate.
Figure 12C:
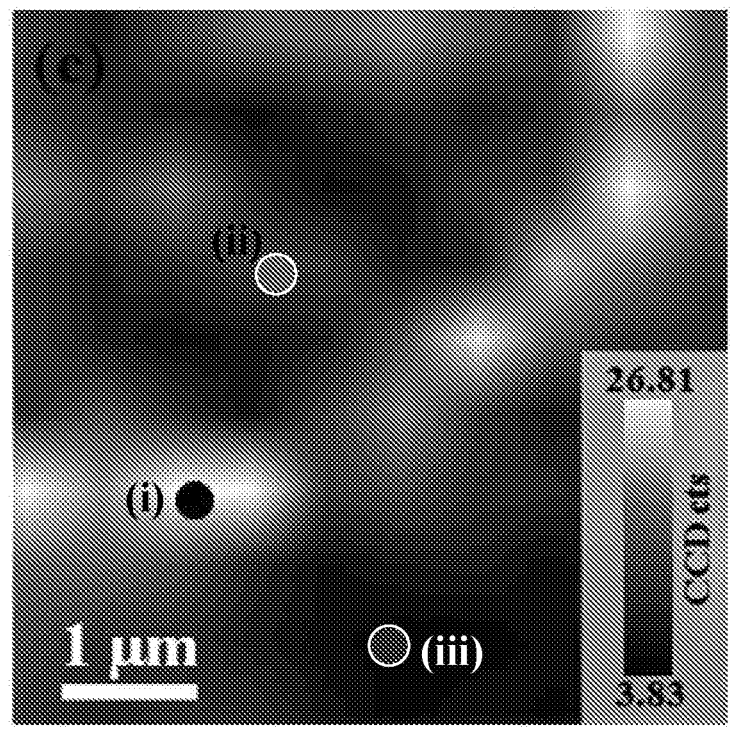
FIG. 12C is a G peak intensity Raman mapping for BCN70 film transferred on a $SiO_2$/Si substrate.
Figure 12D:
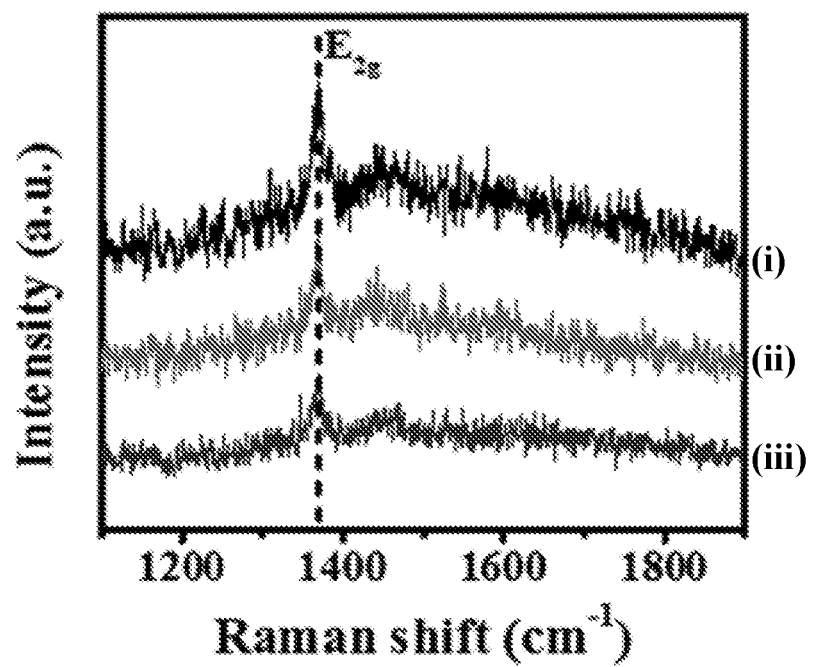
FIG. 12D is a corresponding Raman spectra indicated by the (i) black, (ii) red and (iii) blue dots of FIG. 12A.
Figure 12E:
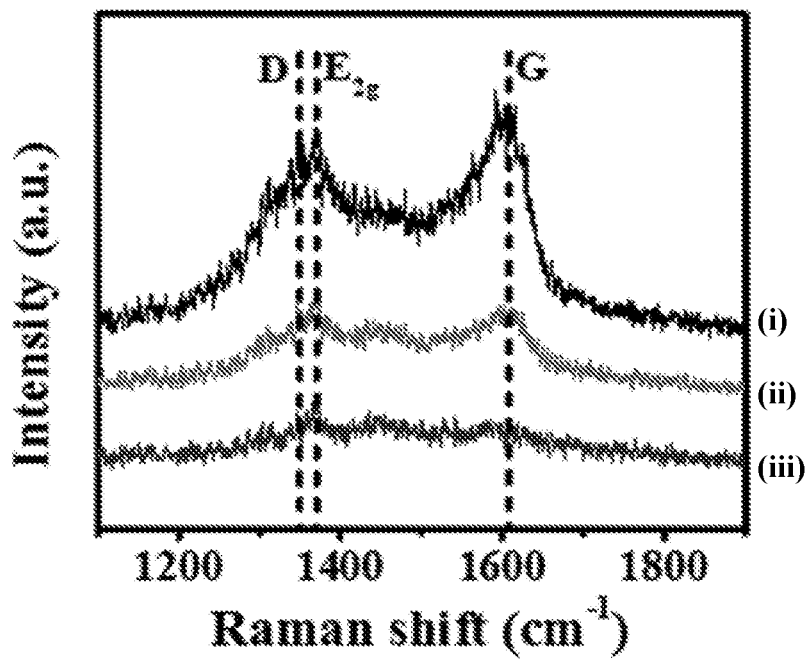
FIG. 12E is a corresponding Raman spectra indicated by the (i) black, (ii) red and (iii) blue dots of FIG. 12B.
Figure 12F:
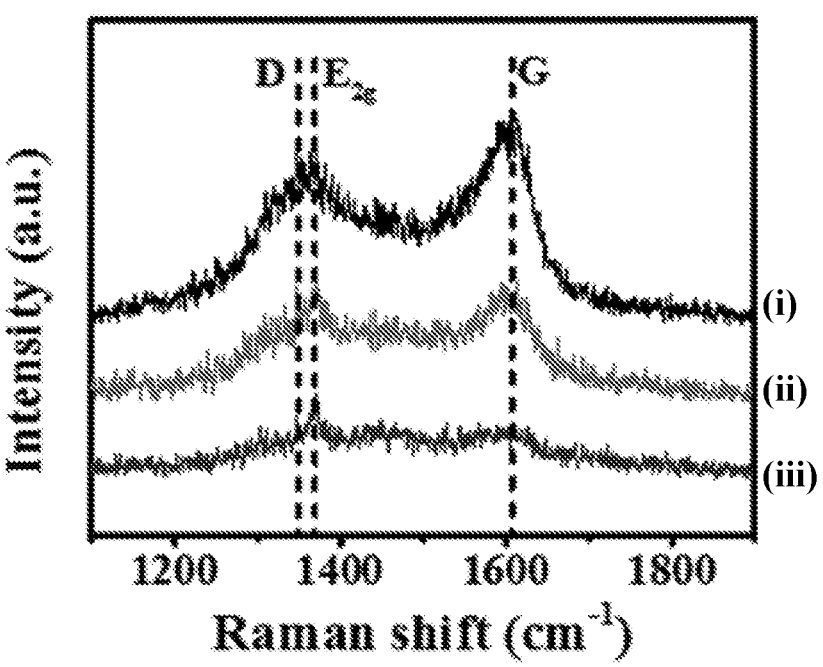
FIG. 12F is a corresponding Raman spectra indicated by the (i) black, (ii) red and (iii) blue dots of FIG. 12C.

FIG. 12A to FIG. 12C show the G peak intensity Raman mappings of the transferred BCN50, BCN60 and BCN70 films, respectively, on SiO$_2$/Si substrates ranging from 1580 to 1620 cm$^{-1}$. FIG. 12D to FIG. 12F show corresponding Raman spectra at different locations indicated in black, red and blue dots on the Raman maps in FIG. 12A to FIG. 12C, respectively. As observed in FIG. 12D, a single Raman peak at about 1370 cm$^{-1}$ corresponding to h-BN was identified throughout the BCN50 film which was similar to that of BN40. Obvious disordered graphitic carbon peaks with broad D and G bands at about 1350 and about 1600 cm$^{-1}$, respectively, may be observed at many regions of the BCN60 and BCN70 films that were grown using higher $T_s$ (FIG. 12E and FIG. 12F), indicating that the nanoparticles were likely to consist of carbonaceous content.

Figure 13A:
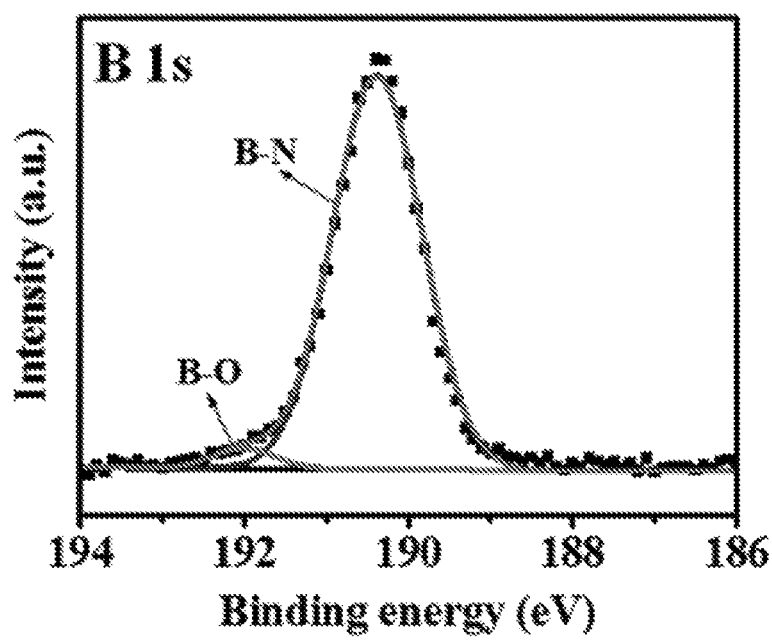
FIG. 13A is a graph showing deconvoluted high-resolution B 1s XPS spectra for BCN60 film.
Figure 13B:
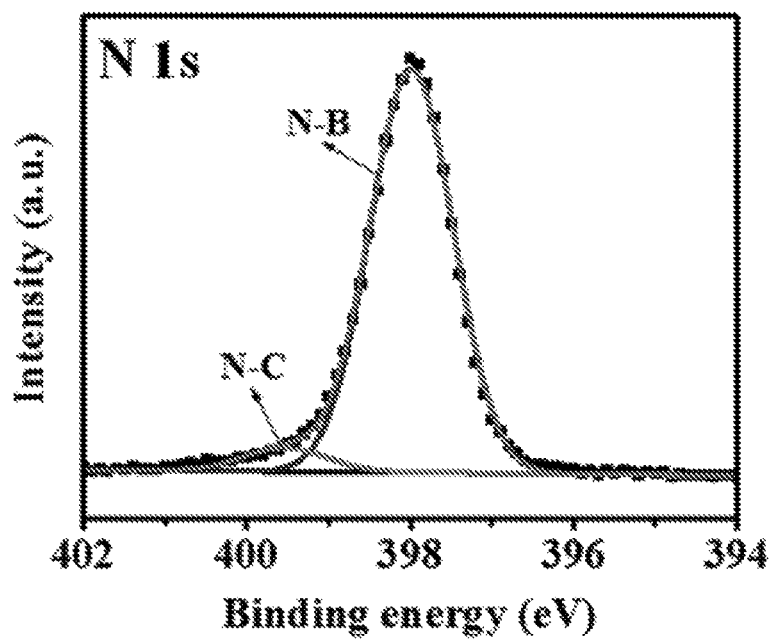
FIG. 13B is a graph showing deconvoluted high-resolution N 1s XPS spectra for BCN60 film.
Figure 13C:
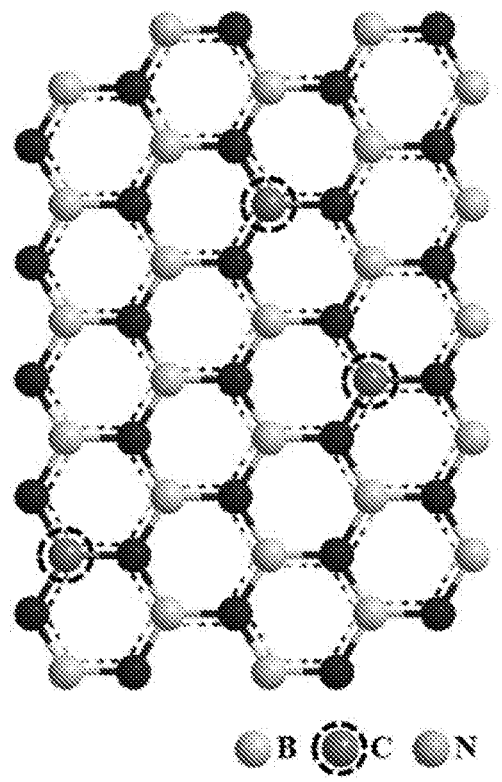
FIG. 13C is a schematic diagram showing chemical bonding structure of the h-BCN film.

XPS was employed to provide further insights into the chemical structure and composition of the as-obtained BCN films. FIG. 13A and FIG. 13B show the deconvoluted B 1s and N 1s XPS spectra for BCN60, respectively. Two peaks located at 190.4 and 192.1 eV, similar to that in FIG. 13D, may be fitted into the B 1s spectrum corresponding to B—N and B—O bonds, respectively (FIG. 13A). For the N 1s spectrum, besides the main component composing of N—B bonding at 398.0 eV, a smaller shoulder at a higher binding energy of 399.6 eV arising from N—C bond was observed (FIG. 13B). The deduced chemical bonding structure of the film is presented in FIG. 13C. The C atoms were "substituted" with the B atoms in the h-BN matrix as evident by the lack of B—C bond in the B 1s spectrum. It is logical that the film assumed this structure because N—C but not B—C bonds exist in the TMAB molecule. Upon higher sublimation rate, not all N—C bonds may be successfully cleaved due to the increased amount of dehydrogenated species and hence, may result in the formation of lightly doped h-BCN films. Based on the integrated characteristic deconvoluted peaks in the N 1s spectra of the h-BCN films, the estimated C doping concentration was about 2% to about 5%.

Figure 13D:
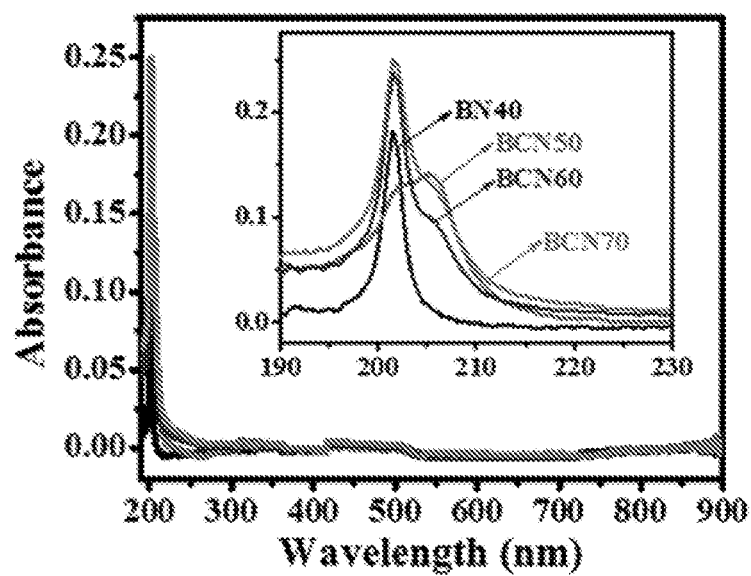
FIG. 13D is a graph showing UV-vis absorbance spectra for the various films grown using different $T_s$.
Figure 14:
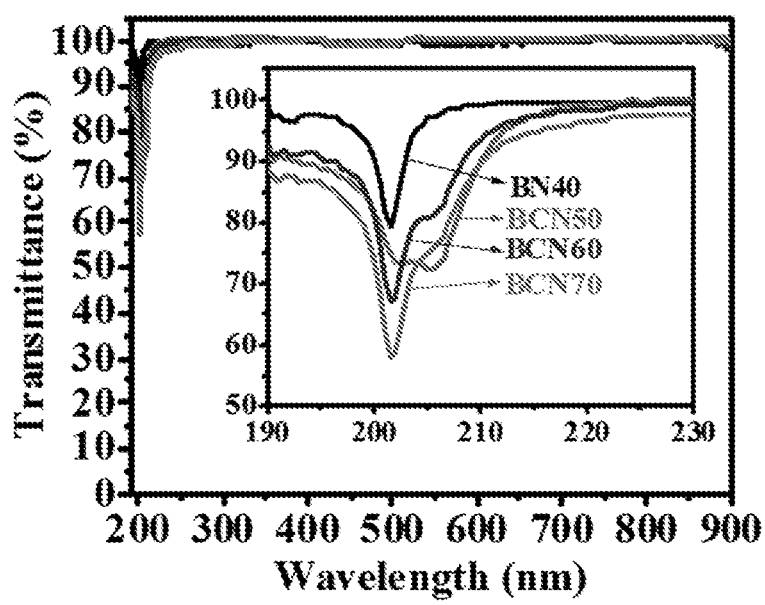
FIG. 14 is a graph showing transmittance spectra of the BN40, BCN50, BCN60 and BCN70 films. The inset shows a magnified plot within the deep UV region. The films were highly transparent throughout the IR and visible spectra.

In order to study the optical properties and the band gap effects of the BN and BCN films, UV-vis spectroscopy was performed on the transferred films on quartz substrates. It was observed that all the films were highly transparent with nearly 100% transmittance throughout the IR and visible spectrum (FIG. 14). FIG. 13D shows the absorbance spectra of the films grown at different $T_s$ and the inset shows the plot focusing at the deep UV region with wavelength ranging from 190 to 230 nm. It was observed that the BN40 film had a single sharp peak at 201.5 nm, corresponding to pristine atomically thin h-BN films. For the other BCN films, an additional shoulder located at 205 nm was observed. This phenomenon was unlike the BN doped graphene films, where the films contain composites of h-BN and graphene domains. In that case, two separate absorption peaks at 202 nm and 270 nm were observed, corresponding to h-BN and π plasmon peak of graphene. For the BCN films disclosed herein, presence of this shoulder indicated band gap narrowing effects due to substitutional doping.

Figure 13E:
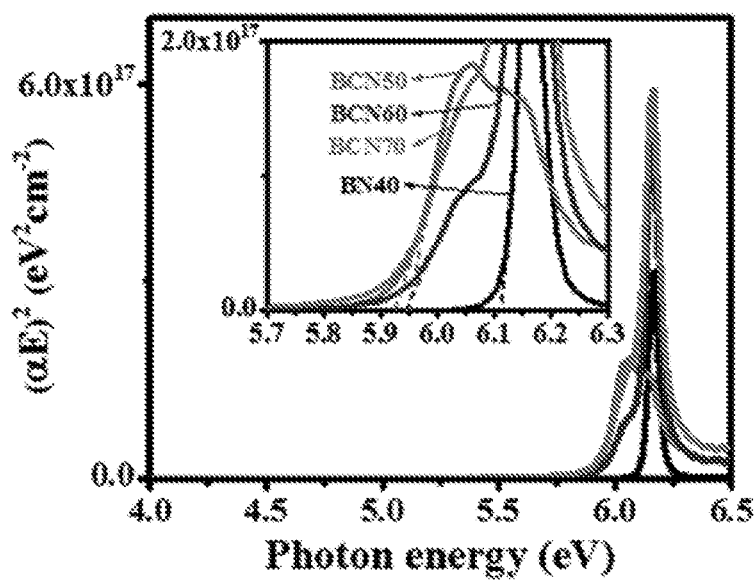
FIG. 13E is a graph showing Tauc's plots for the various films grown using different $T_s$ depicted in FIG. 13D.

To extract the OBG of the films, the absorbance spectra were converted into Tauc's plots (FIG. 13E). The extracted OBG for BN40 was 6.11 eV while the OBGs of the BCN films that were grown at higher $T_s$ fell among the ranges from 5.92 to 5.95 eV.

Example 5: Conclusion (Embodiment 1)

In summary, pristine monolayer h-BN single crystals as well as atomically thin h-BN and h-BCN films were successfully grown by CVD for the first time using a relatively low-cost, less toxic, and commercially available TMAB as a single-source precursor on Cu substrates. The methods disclosed herein may be extended to other amine borane complexes to fabricate 1D, 2D, and 3D BN and BCN nanostructures and h-BN/h-BCN films.

By carefully varying the sublimation temperature ($T_s$) of the precursor, C doping concentration in the h-BN films may be controllable tuned. To synthesis pristine h-BN films, including monolayer single crystals, $T_s$ was limited to 40° C., as further increasing the $T_s$ resulted in the formation of lightly doped h-BCN films due to the presence of uncleaved N—C bonds. The measured absorbance spectra of the h-BCN films exhibited an additional shoulder at 205 nm due to band gap narrowing effect caused by the C dopants. The C doping concentration in the h-BCN films was estimated at about 2% to 5% as identified by XPS. Chemical structure of the h-BCN films grown using this method may be perceived as B atoms being partially substituted by C atoms in an h-BN matrix.

Tunability of its band gap may be achieved by C substitution into the BN matrix. The lightly doped h-BCN films may potentially provide constructive enhancement to the mechanical properties of the film while retaining its electrically insulating nature.

Methods disclosed herein may be used to deposit highly crystalline ultra-thin BN and BCN films on various substrates including but not limited to metal foils and foams (for example, copper (Cu), nickel (Ni), and platinum (Pt)) and other nano-structured materials (for example, graphene, carbon, and boron nitride nanotubes), or substrates which are able to withstand temperatures of at least 700° C. in an inert atmosphere. The highly versatile and industrially acceptable growth technique according to embodiments disclosed herein may provide significant cost savings and mass manufacturability of the resultant products which may be used for a diverse range of applications.

Example 6: Effect of Precursor Sublimation Temperature on Film Deposition and Properties (Embodiment 2)

Trimethylamine borane (TMAB, $(CH_3)_3N.BH_3$) was used as a non-limiting example for all other amine borane complexes to demonstrate feasibility of BN and BCN film growth on Cu substrates. As evidenced using thermogravimetric analysis, TMAB fully decomposes at about 100° C. with 3 endothermic peaks centered at 79.6, 90.3 and 95.5° C., corresponding to the thermal decomposition/melting with the loss of molecular $H_2$ and other various dehydrogenated derivatives. During the growth, the sublimation temperature was varied from 30 to 100° C. and the effects on film deposition and properties were analyzed.

When using a low sublimation temperature from room temperature to 50° C., h-BN film was grown on Cu substrates. Mono- to few-layers may be controllably deposited by increasing the growth time. When the decomposed products of TMAB entered the hot zone in the furnace, intermolecular reactions occurred leading to the formation of trimeric aminoborane, $(MeNH.BH_2)_3$ which further crosslinked into cyclic chains with the framework of h-BN. During h-BN formation by further dehydrocoupling of these cyclic chains, N—C bonds were cleaved in the process under the presence of $H_2$ gas forming volatile products $(CH_{3-x})$.

FIG. 5D and FIG. 5E show the deconvoluted XPS B 1s and N 1s spectra of the as-grown h-BN film, respectively. Both the main peaks centered at 190.3 eV and 398.0 eV for the B 1s and N 1s, respectively, were assigned to $sp^2$-hybridized B—N bond. The chemical structure of h-BN is shown in FIG. 5F.

At higher sublimation temperatures of 60° C. to 100° C., rate of decomposition of the precursor increased and higher amount of vaporized precursors were produced. During film growth, presence of uncleaved N—C bonds may be observed on the film. FIG. 13A and FIG. 13B show the deconvoluted XPS B 1s and N 1s spectra of the h-BCN film. The B 1s spectrum was similar to that of the h-BN film (FIG. 5D). However, for the N spectrum, a smaller shoulder was observed at higher binding energy of 399.6 eV is assigned to N—C bond. The chemical structure of the h-BCN film was shown in FIG. 13C. In this structure, C atoms are substituted by with B atoms in an h-BN matrix.

When the sublimation temperature was further increased above 100° C., TMAB was vaporized very quickly, generating an abundance of both BN and C species. This led to growth of composite BNC films with high nucleation rate. The films grown were often thicker with multilayer domains of BN and C.

TABLE 2 shows the resultant films obtained using various sublimation temperatures for TMAB. For other amine complexes, the required sublimation temperatures to achieve different compositions of C may be tuned proportionately depending on its individual melting temperature.

TABLE 2

Resultant films obtained using various sublimation temperatures

| Sublimation temperature of TMAB | Film type |
| --- | --- |
| Room temperature to 50° C. | BN thin films with negligible C. |
| 60 to 100° C. | BCN thin films with tunable C. |
| Above 100° C. | Multilayer BNC films. |

Example 7: Fabrication of 1D BN/BCN Nanostructures (Embodiment 3)

To synthesize 1D BN- or BCN-nanotubes, a thin layer of metal catalyst including but not limited to Ni or Fe, was deposited on a substrate, of which a non-limiting example is silicon. Upon heat treatment, using the similar CVD process, the thin Ni or Fe film may agglomerate into nano-sized particles.

In general, two types of nanotubes growth mechanisms, namely, tip-growth and root-growth, is possible as depicted in FIG. 15A and FIG. 15B, respectively. In both growth procedures, the BN (or BCN) precursors may be absorbed into the metallic particles and the respective nanotubes may be formed by growing upwards following the outer perimeter of the catalyst. The only difference in the two type of growth is that for tip-growth, the catalysts may be lifted off the surface of the substrate following the nanotubes, while for root-growth, the catalysts may remain at the surface of the substrate. Both vertically aligned or "spaghetti-like" nanotubes may be obtained using this CVD growth method.

Figure 16:
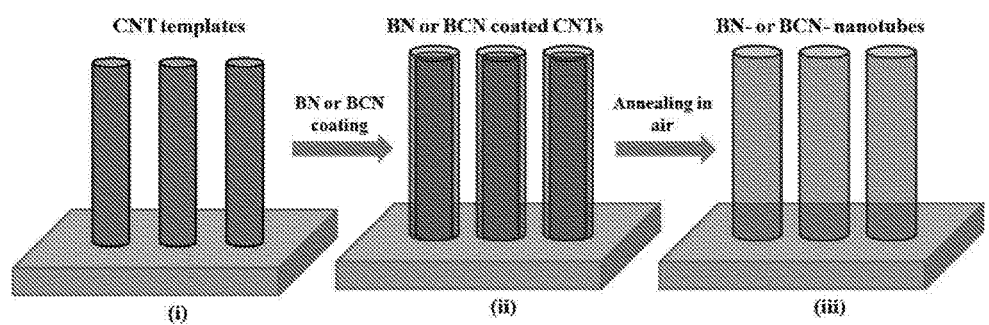
FIG. 16 is a schematic diagram showing synthesis of BN- or BCN-nanotubes using template-assisted CVD.

Similarly, BN- and BCN-nanotubes may also be achieved via a template-assisted CVD approach (FIG. 16). For example, by using commercially available carbon nanotubes as starting substrates, BN or BCN layers were coated conformally onto the outer walls of the nanotubes. As the BN and BCN layers were more resistant to oxidation at higher temperature as compared to the carbon nanotubes, the inner carbon nanotubes may be burned away by annealing in air at about 400 to 700° C. After annealing, the remaining BN or BCN coating layers may retain the morphological structure of the nanotube templates, thus obtaining BN or BCN-nanotubes.

Example 8: Fabrication of 2D BN/BCN Films (Embodiment 4)

Figure 17:
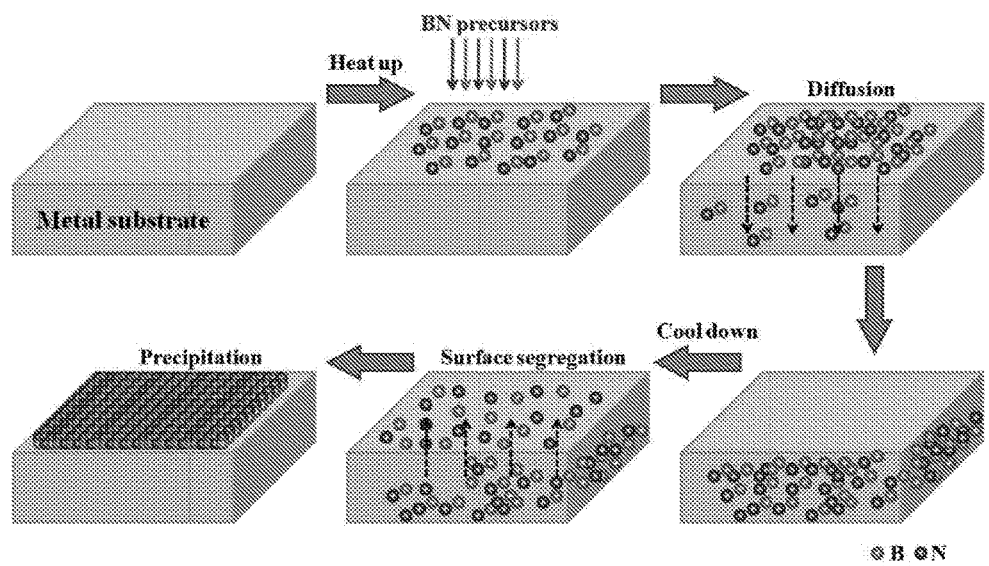
FIG. 17 is a schematic diagram showing growth mechanism of ultra-thin crystalline BN films on metal substrate.

Planar sheets of atomically thin, highly crystalline 2D BN and BCN films were grown epitaxially on catalytic metal substrates including but not limited to Cu and Ni foils as shown in FIG. 17. The as-grown BN or BCN films exhibited a highly ordered atomic arrangement as it followed a strict epitaxial relationship to the metal lattices.

In general, during the growth, the catalytic metal substrate may aid the decomposition of the precursor and the decomposed species were diffused into the bulk of the substrate as evidenced by the lattice expansion of the metallic substrate. Upon cooling down, these active species were segregated to the surface and a thin layer of crystalline film was formed by precipitation. Although such BN and BCN films were grown on metal substrates, it was well-documented these films may be transferred onto any arbitrary substrates using the various types of transfer techniques.

Example 9: Fabrication of 3D BN/BCN Foams (Embodiment 5)

Figure 18:
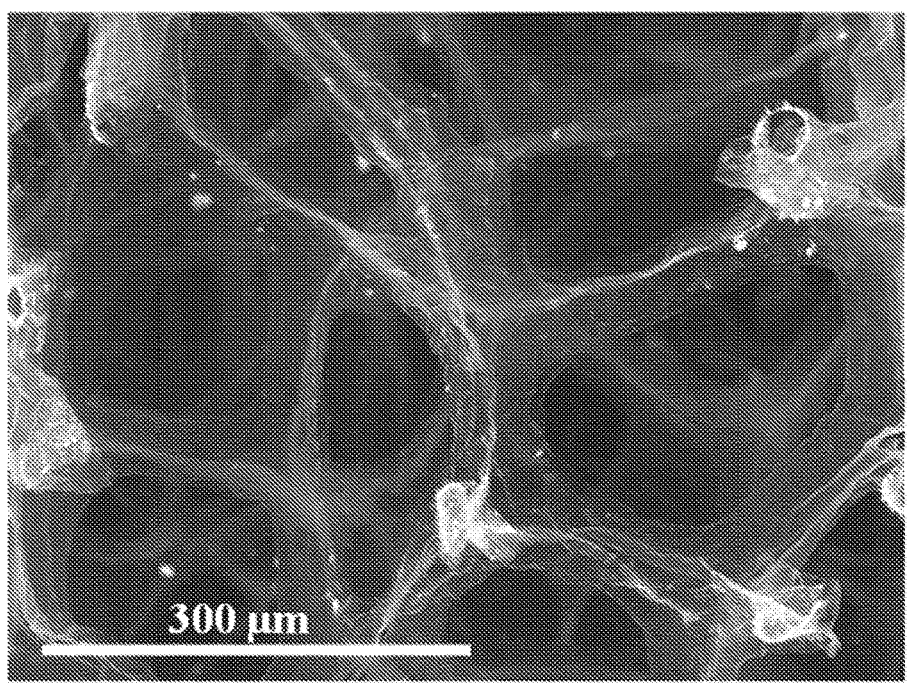
FIG. 18 is a SEM image of a free-standing 3D porous BCN foam.

The CVD technique may also be extended to fabricate 3D networks of BN and BCN using, by way of non-limiting examples, Cu, Ni and other porous foams as substrates. Ultra-thin BN or BCN mono- to few-layer were epitaxitally grown on the entire 3D porous foam via CVD. The growth mechanism may be the same as the growth for 2D films (FIG. 17). Thicknesses of the BN or BCN layer may be controlled through changing various growth parameters such as increasing growth duration and the quantity of precursor used. Free-standing 3D BN or BCN foams, as shown in FIG. 18, may be obtained by subsequently removing the porous substrate through a wet etch process using the appropriate etchant for a specific type of metal.

Example 10: Commercial Applications (Embodiment 6)

The process to grow BN and BCN layers on various substrates may be applied for ultraviolet (UV) lasing devices, protective coatings, substrate/dielectric for 2D materials, band gap engineering materials, ultra-light/flexible/transparent electronics, thermal interface material, top-based heat spreader for electronics, 3D BN/BCN foams for pollutant purification, thermal management, and space applications.

Example 10.1: Mass Manufacturing of 2D BN/BCN Films

Mass production of 2D BN and BCN films via CVD may be achieved at significantly lower cost using amine borane complexes as precursors. The tunability of C-doping in the films may be controlled by the sublimation temperature of the precursor, and thickness of the film may be tuned by varying the growth time together with other parameters such as pressure, temperature, and gas flow. By using industrial furnaces, size of the 2D films may be further scaled-up to wafer-sized substrates and beyond.

Example 10.2: Band Gap Engineering of BCN Films

Incorporation of C doping in the BCN films enabled band gap tunability. Mono- to few-layer h-BN has a wide band gap of about 5 to 6 eV. By doping these films with C, band gap narrowing was observed. With varying amount of C, band gap narrowing effect is expected to cover a wide range from 0 to 6 eV. A band gap of 0 eV is essentially graphene with all C atoms (i.e. all the BN atoms are substituted with C). Such hybrid materials with band gap tunability may be used for optics, optoelectronics and electronics applications.

Example 10.3: BN/BCN Coatings

Due to the high thermal and chemical stability as well as the strong mechanical properties of BN, both BN and BCN films may provide high thermal, oxidation and wear resistance to the material that is coated. Various embodiments disclosed herein enable a direct coating method (i.e. for metals), or the as-grown films may be transferred to any arbitrary substrates to encapsulate the more susceptible material. These coated BN layers may prevent degradation to other nano-structured materials (i.e. graphene, carbon nanotubes, transition metal dichalcogenides and black phosphorous) which are more vulnerable upon exposure to atmosphere (i.e. oxidation).

Example 10.4: 3D BN/BCN with Foam-like Structure

Mass production of 3D BN and BCN foams via CVD was achieved at significantly lower cost using amine borane complexes as precursors, similar to the 2D version. These free-standing porous BN and BCN foams may have a wide range of applications for thermal management, composites for polymers, flexible electronics, and pollutant purification as well as for space applications.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of preparing a boron nitride material, the method comprising
providing a substrate, wherein the substrate is a metallic substrate or graphene or a substrate having one or more carbon nanotubes, and
sublimating an amine borane complex onto the substrate, the amine borane complex having general formula $R_3N \cdot BX_3$, wherein
X at each occurrence is independently selected from the group consisting of hydrogen and a halogen, and R at each occurrence is independently a linear or branched, unsubstituted alkyl with 1 to 20 carbon atoms; and
wherein the sublimating is carried out (i) at a temperature of about 50° C. or less to obtain a boron nitride material consisting essentially of boron nitride, or (ii) at a temperature of greater than about 50° C. and less than about 100° C. to obtain a boron nitride material doped with about 2 wt % to about 5 wt % carbon, or (iii) at a temperature in the range of about 100° C. to about 200° C. to obtain a boron nitride composite comprising one or more domains of boron nitride and carbon.

2. The method according to claim 1, wherein the boron nitride material is a boron nitride nanotube.

3. The method according to claim 2, wherein providing the substrate comprises providing a substrate having a layer of a metal in discrete particulate form arranged on a support.

4. The method according to claim 2, wherein providing the substrate comprises providing a substrate having one or more carbon nanotubes.

5. The method according to claim 4, further comprising removing the one or more carbon nanotubes by annealing the substrate following sublimating of the amine borane complex onto the substrate in an environment containing oxygen at a temperature in the range of about 400° C. to about 700° C.

6. The method according to claim 1, wherein providing the substrate comprises providing a layer of a metal arranged on a porous support to form the boron nitride material as a porous boron nitride material.

7. The method according to claim 6, further comprising removing the substrate by subjecting the substrate to an etching process following sublimating of the amine borane complex onto the substrate.

8. The method according to claim 1, wherein providing the substrate comprises providing a layer of a metal in continuous form arranged on a support to form the boron nitride material as a boron nitride film.

9. The method according to claim 8, further comprising removing the substrate by subjecting the substrate to an electrochemical delamination process following sublimating of the amine borane complex onto the substrate.

10. The method according to claim 1, wherein providing the substrate comprises annealing the substrate in an inert environment at a temperature of about 700° C. or more.

11. The method according to claim 1, further comprising carrying out the sublimating of the amine borane complex onto the substrate for a time period in the range from about 5 minutes to about 20 minutes to form the boron nitride material as a monolayer on the substrate.

12. The method according to claim 1, wherein the boron nitride material consisting essentially of boron nitride or doped with about 2 wt % to about 5 wt % carbon comprises one or more single-crystal domains, wherein each of the one or more single-crystal domains has a maximal dimension of 100 μm or more.

13. The method according to claim 1, wherein the boron nitride material consisting essentially of boron nitride is a crystalline film.

14. The method according to claim 1, wherein the boron nitride material doped with about 2 wt % to about 5 wt % carbon is a crystalline film.

* * * * *